(12) United States Patent
Kim et al.

(10) Patent No.: US 10,038,158 B2
(45) Date of Patent: Jul. 31, 2018

(54) ORGANIC LIGHT-EMITTING DEVICE

(71) Applicant: Samsung Display Co., Ltd., Yongin, Gyeonggi-Do (KR)

(72) Inventors: Sung-Wook Kim, Yongin (KR); Myeong-Suk Kim, Yongin (KR); Jae-Hong Kim, Yongin (KR); Jin-Soo Hwang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 731 days.

(21) Appl. No.: 14/189,689

(22) Filed: Feb. 25, 2014

(65) Prior Publication Data

US 2015/0090962 A1 Apr. 2, 2015

(30) Foreign Application Priority Data

Sep. 27, 2013 (KR) ........................ 10-2013-0115702

(51) Int. Cl.
*H01L 51/50* (2006.01)
*H01L 51/00* (2006.01)

(52) U.S. Cl.
CPC ...... *H01L 51/5072* (2013.01); *H01L 51/0052* (2013.01); *H01L 51/0061* (2013.01); *H01L 51/0067* (2013.01); *H01L 51/0072* (2013.01); *H01L 51/0085* (2013.01); *H01L 51/5012* (2013.01); *H01L 51/5056* (2013.01)

(58) Field of Classification Search
CPC ............ H01L 51/0085; H01L 51/0061; H01L 51/0067; H01L 51/5072; H01L 51/0052; H01L 51/0072; H01L 51/5056; H01L 51/5012
See application file for complete search history.

(56) References Cited

U.S. PATENT DOCUMENTS

| | | |
|---|---|---|
| 2008/0242871 A1 | 10/2008 | Kawakami et al. |
| 2009/0184634 A1* | 7/2009 | Kamatani ............ C07F 15/004 313/504 |
| 2011/0279020 A1 | 11/2011 | Inoue et al. |
| 2012/0235123 A1 | 9/2012 | Lee et al. |
| 2013/0119355 A1 | 5/2013 | Han et al. |

FOREIGN PATENT DOCUMENTS

| | | | |
|---|---|---|---|
| KR | 10-2003-0059288 A | 7/2003 | |
| KR | 10-2003-0074631 A | 9/2003 | |
| KR | 10-2011-0015836 A | 2/2011 | |
| KR | 10-2012-0034648 A | 4/2012 | |
| KR | 10-2012-0089223 A | 8/2012 | |
| KR | 10-2013-0051807 A | 5/2013 | |
| WO | WO 2011/019156 * | 2/2011 | ............ C09K 11/06 |

* cited by examiner

*Primary Examiner* — Alexander Kollias
(74) *Attorney, Agent, or Firm* — Knobbe Martens Olson & Bear LLP

(57) ABSTRACT

In an aspect, an organic light-emitting device is provided.

8 Claims, 1 Drawing Sheet

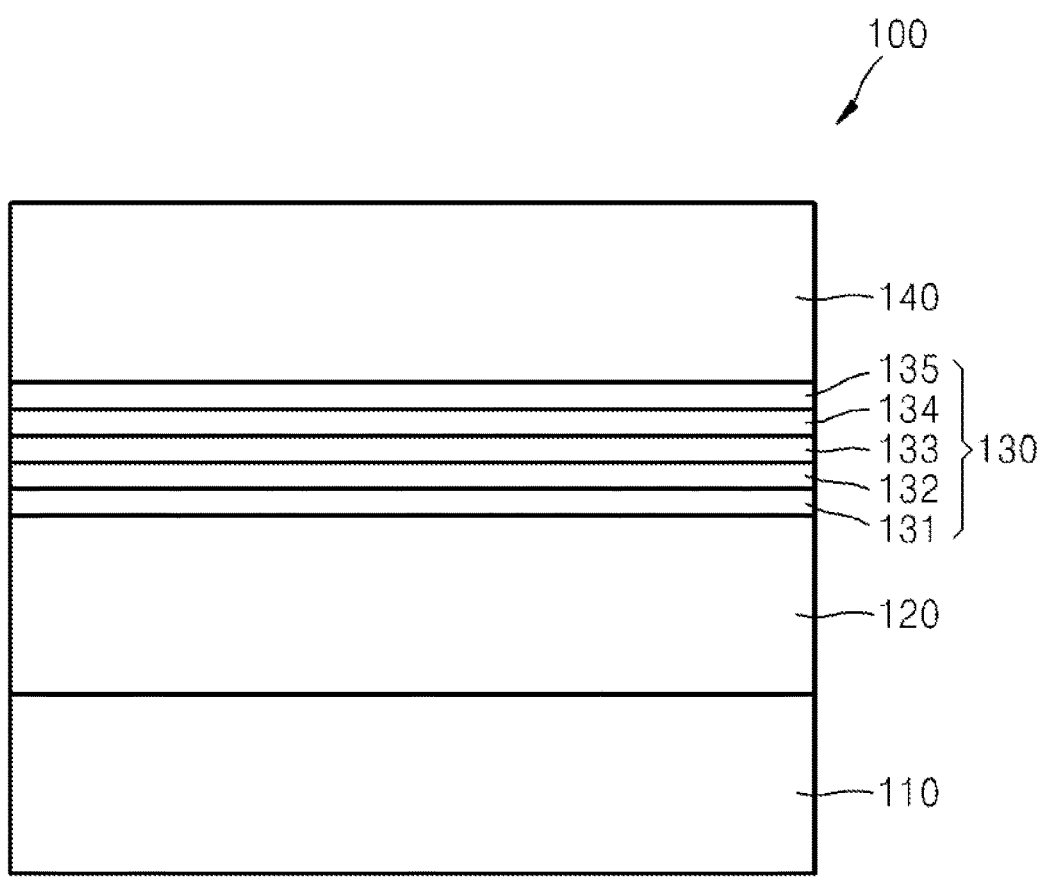

ORGANIC LIGHT-EMITTING DEVICE

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0115702, filed in the Korean Intellectual Property Office on Sep. 27, 2013, the disclosure of which is incorporated herein by reference in its entirety.

BACKGROUND

Field

This disclosure relates to an organic light-emitting device.

Description of the Related Technology

Organic light-emitting devices (OLEDs) are self-emitting devices, have advantages such as a wide viewing angle, excellent contrast, quick response, high brightness, and excellent driving voltage, and can provide multicolored images.

A general OLED has a structure including a substrate, an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. Carriers, such as the holes and electrons, recombine in the EML to generate excitons. When the excitons drop from an excited state to a ground state, light is emitted.

SUMMARY

One or more embodiments include an organic light-emitting device.

Additional aspects will be set forth in part in the description which follows and, in part, will be apparent from the description, or may be learned by practice of the presented embodiments.

Some embodiments provide an organic light-emitting device (OLED) including a first electrode; a second electrode facing the first electrode; an organic layer including an emission layer disposed between the first electrode and the second electrode, wherein the emission layer includes at least one selected from compounds represented by Formula 1 and at least one selected from compounds represented by Formula 3:

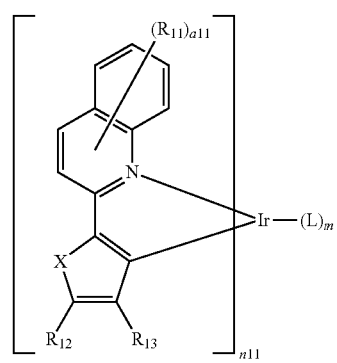

FORMULA 1

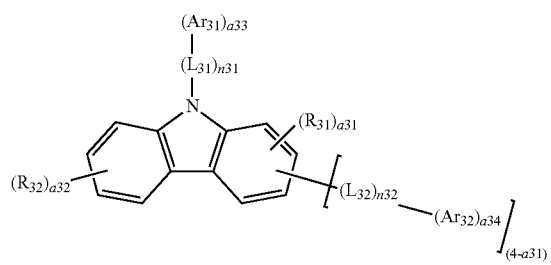

FORMULA 3 wherein, in Formulae 1 and 3, $R_{11}$ is selected from a hydrogen atom, a deuterium atom, a halogen atom, a substituted or unsubstituted $C_1$-$C_{30}$ alkyl group, a substituted or unsubstituted a substituted or unsubstituted $C_6$-$C_{20}$ aryl group, and a substituted or unsubstituted $C_2$-$C_{20}$ heteroaryl group;

a11 is an integer of 1 to 6;

X is an oxygen atom or a sulfur atom;

$R_{12}$ and $R_{13}$ are each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, and —CO($Q_1$), wherein $Q_1$ is a substituted or unsubstituted $C_1$-$C_{30}$ alkyl group or a substituted or unsubstituted $C_6$-$C_{60}$ aryl group, wherein $R_{12}$ and $R_{13}$ are optionally linked to each other and form a substituted or unsubstituted saturated ring or a substituted or unsubstituted unsaturated ring;

n11 is an integer of 1 to 3;

L is an organic ligand;

m is an integer of 0 to 2, and when m is 2, the two L groups are identical to or different from each other;

$Ar_{31}$ and $Ar_{32}$ are each independently selected from i) a $C_1$-$C_{60}$ alkyl group;

ii) a $C_6$-$C_{60}$ aryl group and a $C_2$-$C_{60}$ heteroaryl group; and iii) a $C_6$-$C_{60}$ aryl group and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

$L_{31}$ and $L_{32}$ are each independently selected from i) a $C_6$-$C_{60}$ arylene group and a $C_2$-$C_{60}$ heteroarylene group; and ii) a $C_6$-$C_{60}$ arylene group and a $C_2$-$C_{60}$ heteroarylene group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

n31 and n32 are each independently an integer of 0 to 3;

$R_{31}$ and $R_{32}$ are each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group; and a31 to a34 are each independently an integer of 0 to 4

Some embodiments provide an OLED including a first electrode; a second electrode facing the first electrode; and an organic layer including an emission layer disposed between the first electrode and the second electrode, wherein the organic layer includes a hole transporting region disposed between the first electrode and the emission layer, wherein the emission layer includes at least one selected from compounds represented by Formula 1 and at least one selected from compounds represented by Formula 3, wherein the hole transporting region includes at least one selected from compounds represented by Formula 4:

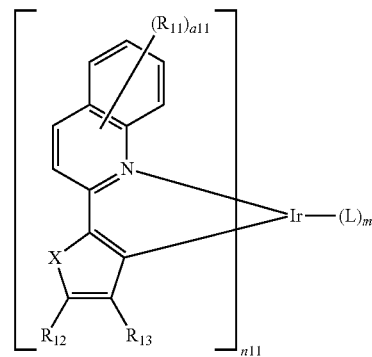

FORMULA 1

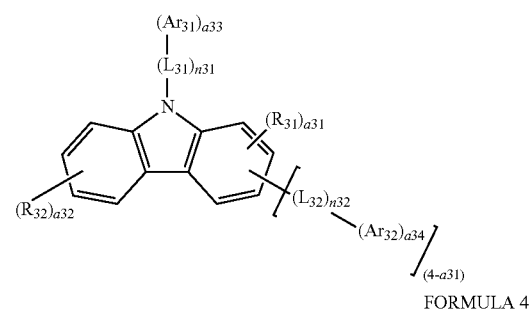

FORMULA 3

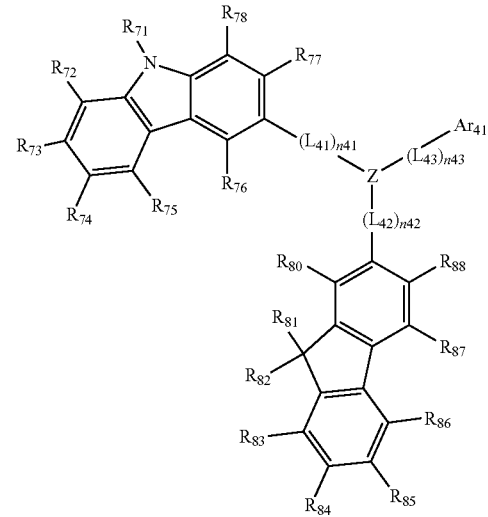

FORMULA 4 wherein, in Formulae 1, 3, and 4, $R_{11}$ is selected from a hydrogen atom, a deuterium atom, a halogen atom, a substituted or unsubstituted $C_1$-$C_{30}$ alkyl group, a substituted or unsubstituted a substituted or unsubstituted $C_6$-$C_{20}$ aryl group, and a substituted or unsubstituted $C_2$-$C_{20}$ heteroaryl group;

a11 is an integer of 1 to 6;

X is an oxygen atom or a sulfur atom;

$R_{12}$ and $R_{13}$ are each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, and —CO($Q_1$), wherein $Q_1$ is a substituted or unsubstituted $C_1$-$C_{30}$ alkyl group or a substituted or unsubstituted $C_6$-$C_{60}$ aryl group, wherein $R_{12}$ and $R_{13}$ are optionally linked to each other and form a substituted or unsubstituted saturated ring or a substituted or unsubstituted unsaturated ring;

n11 is an integer of 1 to 3;

L is an organic ligand;

m is an integer of 0 to 2, and when m is 2, the two L groups are identical to or different from each other;

Z is a boron atom (B), a nitrogen atom (N), or a phosphorus atom (P);

$Ar_{31}$ and $Ar_{32}$ are each independently selected from
i) a $C_1$-$C_{60}$ alkyl group;
ii) a $C_6$-$C_{60}$ aryl group and a $C_2$-$C_{60}$ heteroaryl group; and
iii) a $C_6$-$C_{60}$ aryl group and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

$L_{31}$ and $L_{32}$ are each independently selected from
i) a $C_6$-$C_{60}$ arylene group and a $C_2$-$C_{60}$ heteroarylene group; and
ii) a $C_6$-$C_{60}$ arylene group and a $C_2$-$C_{60}$ heteroarylene group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

n31 and n32 are each independently an integer of 0 to 3;

$R_{31}$ and $R_{32}$ are each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group;

a31 to a34 are each independently an integer of 0 to 4;

Z is a boron atom (B), a nitrogen atom (N), or a phosphorus atom (P);

$L_{41}$ and $L_{43}$ are each independently selected from
i) a $C_6$-$C_{60}$ arylene group; and
ii) a $C_6$-$C_{60}$ arylene group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

n41 to n43 are each independently an integer of 0 to 5;

$R_{71}$ to $R_{78}$ and $R_{81}$ to $R_{89}$ are each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group; and $Ar_{41}$ is selected from
i) a $C_6$-$C_{60}$ aryl group and a $C_2$-$C_{60}$ heteroaryl group;
ii) a $C_6$-$C_{60}$ aryl group and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic diagram illustrating an organic light-emitting device (OLED) according to an embodiment of the present disclosure.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the expression "organic layer" refers to a single layer and/or multiple layers disposed between a first electrode and a second electrode of an organic light-emitting device (OLED).

As used herein, the expression "the organic layer may include at least one compound represented by Formula 1" may be understood as "the organic layer may include one compound that belongs to the scope of compounds represented by Formula 1 or at least two different compounds selected from to the scope of compounds represented by Formula 1".

FIG. 1 is a schematic cross-sectional view of an OLED 100 according to an embodiment of the present invention. Hereinafter, a structure and a manufacturing method of an OLED will be described in more detail with reference to FIG. 1.

The OLED 100 includes a substrate (not shown), a first electrode 120, an organic layer 130, and a second electrode 140.

In some embodiments, the substrate may be a substrate used in a general OLED, and may be a glass substrate or a transparent plastic substrate having excellent mechanical strength, thermal stability, transparency, surface smoothness, ease of handling, and waterproofness.

In some embodiments, the first electrode 120 may be formed by applying a first electrode material on the substrate by deposition or sputtering. When the first electrode 120 is an anode, the first electrode material may be selected from materials having a high work function to facilitate hole injection. The first electrode 120 may be a reflective electrode or a transparent electrode. Examples of the first electrode material may include indium-tin oxide (ITO), Indium-zinc-oxide (IZO), tin oxide ($SnO_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 120 may be formed as a reflective electrode.

In some embodiments, the first electrode 120 may have a single layer structure or a multi-layered structure including at least two layers. For example, the first electrode 120 may have a three-layered structure, e.g., ITO/Ag/ITO, but is not limited thereto.

In some embodiments, an organic layer 130 is formed on the first electrode 120.

In some embodiments, the organic layer includes an emission layer (EML) 133.

In some embodiments, the organic layer 130 includes a hole transporting region disposed between the first electrode 120 and the EML 133, and the hole transporting region may include at least one selected from a hole injection layer (HIL) 131, a hole transport layer (HTL) 132, a functional layer having both hole injection and transport abilities (hereinafter, referred to as "H-functional layer"), an electron blocking layer (EBL), and a buffer layer.

In some embodiments, the organic layer 130 includes an electron transporting region disposed between the EML 133 and the second electrode 140, and the electron transporting region may include at least one selected from a hole blocking layer (HBL), an electron transport layer (ETL) 134, and an electron injection layer (EIL) 135.

In some embodiments, the HIL 131 may be formed on the first electrode 120 by using various methods, such as vacuum deposition, spin coating, casting, or LB deposition.

When the HIL 131 is formed by vacuum deposition, the deposition conditions may vary according to a compound used as a material for forming the HIL 131 and a structure and thermal characteristics of a desired HIL. For example, the deposition condition may be, but not limited to, a deposition temperature of about 100° C. to about 500° C., a degree of vacuum of about $10^{-8}$ torr to about $10^{-3}$ torr, and a deposition speed of about 0.01 Å/sec to about 100 Å/sec.

When the HIL 131 is formed by spin coating, the coating condition may vary according to a compound used as a material for forming the HIL 131, a structure of a desired HIL, and thermal characteristics. For example, the coating condition may be, but not limited to, a coating speed of about 2,000 rpm to about 5,000 rpm and a heat treatment temperature for removing a solvent after coating of about 80° C. to about 200° C.

In some embodiments, a thickness of the HIL 131 may be in a range of about 100 Å to about 10,000 Å, for example, in a range of about 100 Å to about 1,000 Å. When a thickness of the HIL 131 is within this range, satisfactory hole injecting properties may be obtained without a substantial increase in driving voltage.

Next, the HTL 132 may be formed on the HTL 131 by vacuum deposition, spin coating, casting, or LB deposition. When the HTL is formed by vacuum deposition or spin coating, the deposition and coating conditions vary depending on a used compound, but generally the conditions may be almost the same as the conditions for forming the HIL 131.

In some embodiments, a thickness of the HTL 132 may be in a range of about 50 Å to about 2,000 Å, for example, in a range of about 100 Å to about 1,500 Å. When a thickness of the HTL 132 is within this range, satisfactory hole transporting properties may be obtained without a substantial increase in driving voltage.

In some embodiments, the H-functional layer, instead of the HIL 131 and the HTL 132, may be formed on the first electrode 120 by using various methods, such as vacuum deposition, spin coating, casting, or LB deposition. When the H-functional layer is formed by vacuum deposition or spin coating, the deposition and coating conditions vary depending on a used compound, but generally the conditions may be almost the same as the conditions for forming the HIL 131.

In some embodiments, a thickness of the H-functional layer may be in a range of about 500 Å to about 10,000 Å, for example, in a range of about 100 Å to about 1,000 Å. When a thickness of the H-functional layer is within this range, satisfactory hole injecting and transporting properties may be obtained without a substantial increase in driving voltage.

In some embodiments, the hole transporting region may include at least one selected from compounds represented by Formula 4:

FORMULA 4

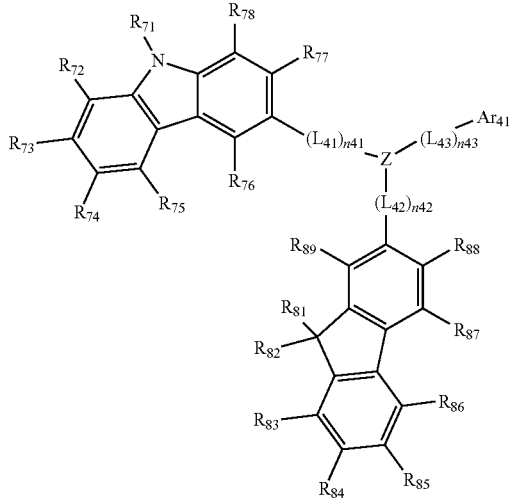

In Formula 4, Z may be a boron atom (B), a nitrogen atom (N), or a phosphorus atom (P).

For example, in Formula 4, Z may be a nitrogen atom, but is not limited thereto.

In Formula 4, $L_{41}$ to $L_{43}$ may be each independently selected from
i) a $C_6$-$C_{60}$ arylene group; and
ii) a $C_6$-$C_{60}$ arylene group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfornic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 4, $L_{41}$ to $L_{43}$ may be each independently selected from, but not limited to,
i) a phenylene group, a pentalenylene group, an indenylene group, a naphthylene group, an azulenylene group, a heptalenylene group, an indacenylene group, an acenaphtylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, and a hexacenylene group; and
ii) a phenylene group, a pentalenylene group, an indenylene group, a naphthylene group, an azulenylene group, a heptalenylene group, an indacenylene group, an acenaphtylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, and a hexacenylene group, each substituted with at least one selected from a deuterium atom, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 4, $L_{41}$ to $L_{43}$ may be each independently selected from, but not limited to,
i) a phenylene group, a naphthylenyl group, and an anthracenylene group; and
ii) a phenylene group, a naphthylenyl group, and an anthracenylene group, each substituted with at least one of a deuterium atom, a halogen atom, a hydroxyl group, a cyano group, a nitro group, and a substituted or unsubstituted $C_1$-$C_{60}$ alkyl group.

In Formula 4, n41 denotes the number of $L_{41}$, and n41 may be an integer of 0 to 5. When n41 is an integer of 2 or greater, each $L_{41}$ may be identical to or different from each other.

In Formula 4, n42 denotes the number of $L_{42}$, and n42 may be an integer of 0 to 5. When n42 is an integer of 2 or greater, each $L_{42}$ may be identical to or different from each other.

In Formula 4, n43 denotes the number of $L_{43}$, and n43 may be an integer of 0 to 5. When n43 is an integer of 2 or greater, each $L_{43}$ may be identical to or different from each other.

For example, in Formula 4, n41 to n43 may be each independently an integer of 0 or 1, but are not limited thereto.

In Formula 4, $R_{71}$ to $R_{78}$ and $R_{81}$ to $R_{89}$ may be each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 4, $R_{71}$ to $R_{78}$ and $R_{81}$ to $R_{89}$ may be each independently selected from, but not limited to,
i) a hydrogen atom, a deuterium atom, a halogen atom, a cyano group, a nitro group, a $C_1$-$C_{60}$ alkyl group, and a $C_6$-$C_{60}$ aryl group;
ii) a $C_1$-$C_{60}$ alkyl group substituted with at least one of a hydrogen atom, a deuterium atom, a halogen atom, a cyano group, and a nitro group; and
iii) a $C_6$-$C_{60}$ aryl group substituted with at least one of a hydrogen atom, a deuterium atom, a halogen atom, a cyano group, a nitro group, and a $C_1$-$C_{60}$ alkyl group.

For example, in Formula 4, $R_{71}$ to $R_{78}$ and $R_{81}$ to $R_{89}$ may be each independently selected from, but not limited to, a hydrogen atom, a deuterium atom, —F, a cyano group, a nitro group, a methyl group, an ethyl group, a tert-butyl group, a phenyl group, and a naphthyl group.

In Formula 4, $Ar_{41}$ may be selected from
i) a $C_6$-$C_{60}$ aryl group and a $C_2$-$C_{60}$ heteroaryl group; and
ii) a $C_6$-$C_{60}$ aryl group and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 4, $Ar_{41}$ may be selected from, but not limited to,
i) a $C_6$-$C_{60}$ aryl group and a $C_2$-$C_{60}$ heteroaryl group; and
ii) a $C_6$-$C_{60}$ aryl group and a $C_2$-$C_{60}$ heteroaryl group, each substituted with at least one of a deuterium atom, a halogen atom, a cyano group, a nitro group, a $C_1$-$C_{60}$ alkyl group, and a $C_6$-$C_{60}$ aryl group.

For example, in Formula 4, $Ar_{41}$ may be selected from, but not limited to,
i) a phenyl group, a biphenyl group, a pentalenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group; and
ii) a phenyl group, a biphenyl group, a pentalenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium atom, —F, a cyano group, a nitro group, a methyl group, an ethyl group, a tert-butyl group, a phenyl group, and a naphthyl group.

For example, in Formula 4, $Ar_{41}$ may be selected from, but not limited to,
i) a phenyl group, a naphthyl group, an anthryl group, a fluorenyl group, a pyridyl group, a pyrimidyl group, a pyrazinyl group, a triazinyl group, and a carbazol group; and
ii) a phenyl group, a naphthyl group, an anthryl group, a fluorenyl group, a pyridyl group, a pyrimidyl group, a pyrazinyl group, a triazinyl group, and a carbazol group, each substituted with at least one of a deuterium atom, —F, a cyano group, a nitro group, a methyl group, an ethyl group, a tert-butyl group, a phenyl group, and a naphthyl group For example, in Formula 4, $Ar_{41}$ may be selected from, but not limited to,
i) a phenyl group, a naphthyl group, an anthryl group, a fluorenyl group, a pyridyl group, a pyrimidyl group, a pyrazinyl group, a triazinyl group, and a carbazol group; and
ii) a phenyl group, a naphthyl group, an anthryl group, a fluorenyl group, a pyridyl group, a pyrimidyl group, a pyrazinyl group, a triazinyl group, and a carbazol group, each substituted with at least one of a deuterium atom, —F, a cyano group, a nitro group, a methyl group, an ethyl group, a tert-butyl group, a phenyl group, and a naphthyl group.

In some embodiments, the amine-based compound represented by Formula 4 may be represented by Formula 4A, but is not limited thereto:

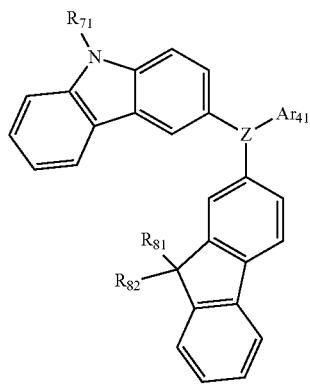

FORMULA 4A

In Formula 4a,

Z is a boron atom (B), a nitrogen atom (N), or a phosphorus atom (P);

$R_{71}$, $R_{81}$, and $R_{82}$ are each independently selected from a hydrogen atom, a deuterium atom, —F, a cyano group, a nitro group, a methyl group, an ethyl group, a tert-butyl group, a phenyl group, and a naphthyl group;

$Ar_{41}$ is selected from i) a phenyl group, a naphthyl group, an anthryl group, a fluorenyl group, a pyridyl group, a pyrimidyl group, a pyrazinyl group, a triazinyl group, and a carbazol group; and ii) a phenyl group, a naphthyl group, an anthryl group, a fluorenyl group, a pyridyl group, a pyrimidyl group, a pyrazinyl group, a triazinyl group, and a carbazol group, each substituted with at least one of a hydrogen atom, a deuterium atom, —F, a cyano group, a nitro group, a methyl group, an ethyl group, a tert-butyl group, a phenyl group, and a naphthyl group.

For example, the compound represented by Formula 4 may be one of Compounds 301 to 309 below but is not limited thereto:

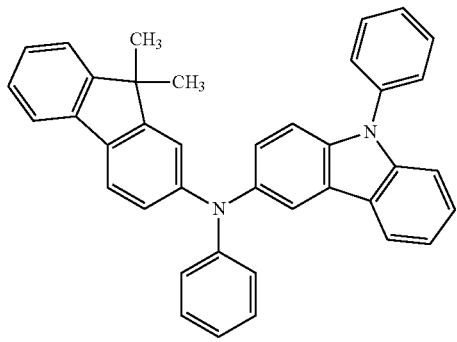

301

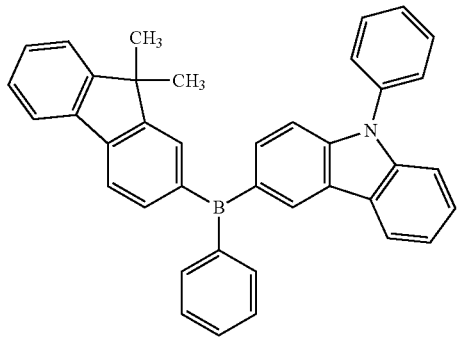

302

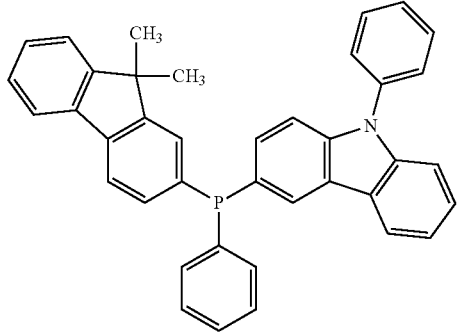

303

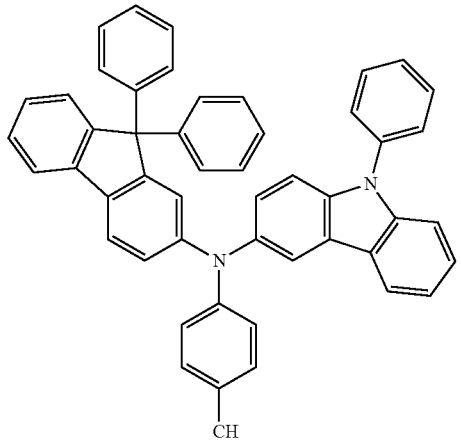

304

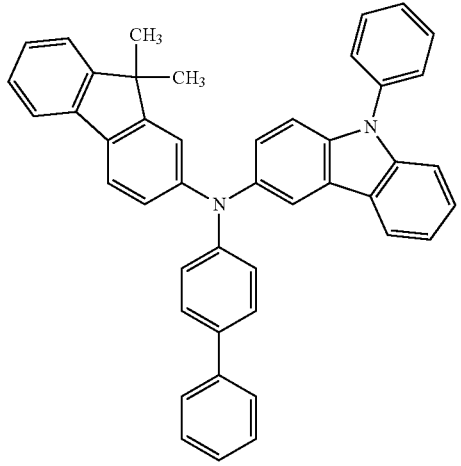

305

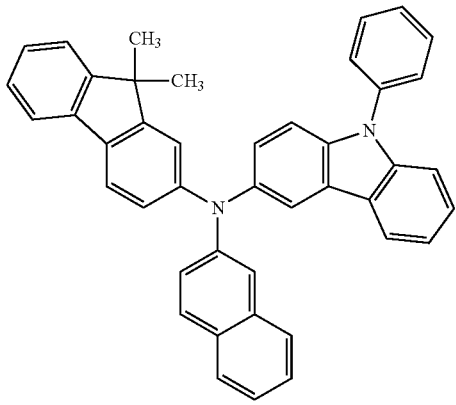

In some embodiments, the compound represented by Formula 4 may be synthesized by using a known organic synthesis method. The synthesis method of the amine-based compound represented by Formula 4 may be easily understood by one of ordinary skill in the art with reference to examples, which will be described later.

In some embodiments, the hole transporting region may further include a known material.

For example, the hole transporting region may further include a known hole injection material, and examples of the known hole injection material may include, but not limited to, N,N'-diphenyl-N,N'-bis-[4-(phenyl-m-tolyl-amino)-phenyl]-biphenyl-4,4'-diamine (DNTPD), a phthalocyanine compound, such as copper phthalocyanine, 4,4',4"-tris(3-methylphenylphenylamino) triphenylamine (m-MTDATA), N,N'-di(1-naphthyl)-N,N'-diphenylbenzidine (NPB), 4,4',4"-tris(N,N-diphenylamino) triphenylamine) (TDATA), 4,4',4"-tris[2-naphthyl(phenyl)amino] triphenylamine) (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), and polyaniline/poly(4-styrenesulfonate) (PANI/PSS):

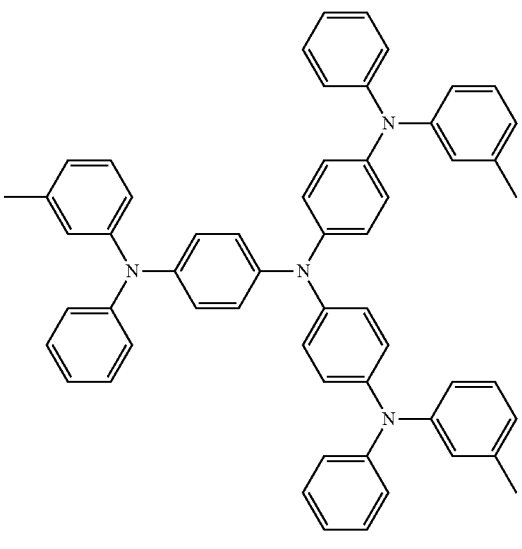

m-MTDATA

-continued

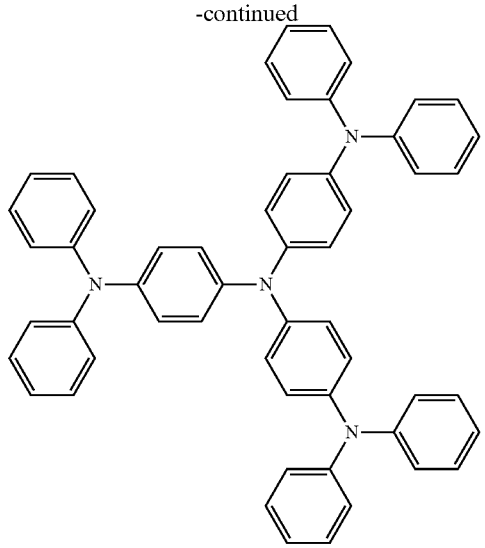

TDATA

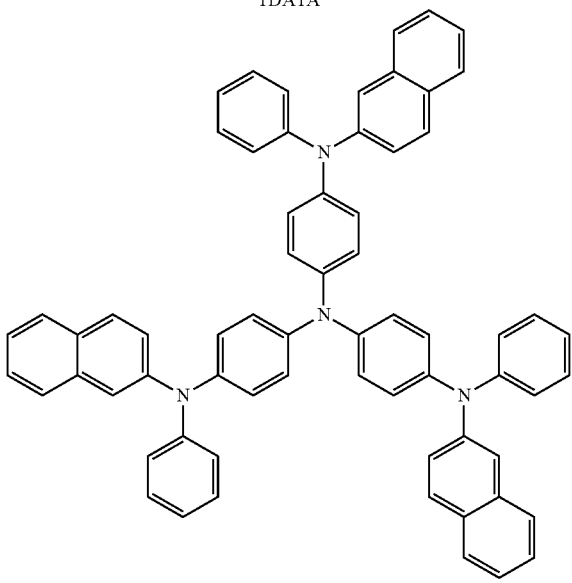

2-TNATA

For example, the HTL may further include a known hole transport material, and examples of the known hole transport material may include, but not limited to, carbazole derivatives, such as N-phenylcarbazole and polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB):

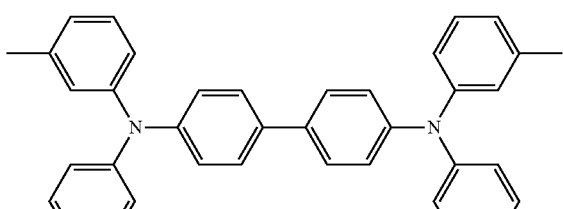

TPD

-continued

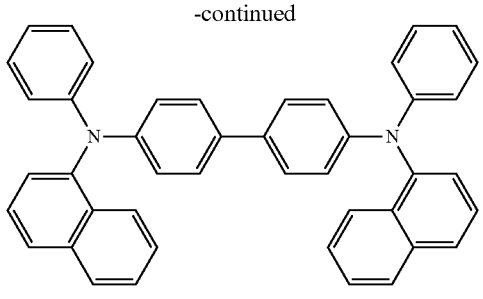

NPB

In some embodiments, the hole transporting region may further include a p-dopant in addition to the known hole injection material, the known hole transport material, and the amine-based compound represented by Formula 4 to increase conductivity of the layers.

The p-dopant may be, for example, one of quinone derivatives, metal oxides, and cyano-containing compounds. Examples of the p-dopant may include, but not limited to, quinone derivatives, such as tetra-cyanoquinodimethane (TCNQ) and 2,3,5,6-tetrafluoro-tetracyano-1,4-benzoquinodimethane (F4-TCNQ); metal oxides, such as a tungsten oxide and a molybdenum oxide; and cyano-containing compounds, such as Compound 100 (HAT-CN):

COMPOUND 100

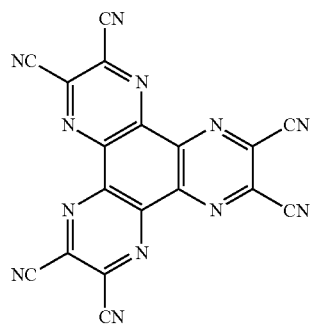

When the hole transporting region further includes the p-dopant, the p-dopant may be homogenously or unhomogeneously dispersed in the hole transporting region.

In some embodiments, the buffer layer may be disposed between the at least one of the HIL 131, the HTL 132, and the H-funcitonal layer and the EML 133. The buffer layer increases efficiency by compensating an optical resonance distance according the wavelength of light emitted from the EML 133. The buffer layer may include a known hole injection material and a known hole transporting material. Also, the buffer layer may include the same material as one of the materials included in the HIL 131, the HTL 132, and the H-funcitonal layer formed under the buffer layer.

In some embodiments, the EBL may be disposed between at least one of the HIL 131, the HTL 132, and the H-functional layer, and the EML 133. In some embodiments, the EBL increases lifespan of the OLED 100 by blocking electrons transported from the EML.

Subsequentially, the EML 133 may be formed on the hole transrpoting region by vacuum deposition, spin coating, casting, or LB deposition. When the EML is formed by vacuum deposition or spin coating, the deposition and coating conditions vary according to a used compound, but generally the condition may be almost the same as the condition for forming the HIL 131.

In some embodiments, the EML 133 may include at least one compounds represented by Formula 1:

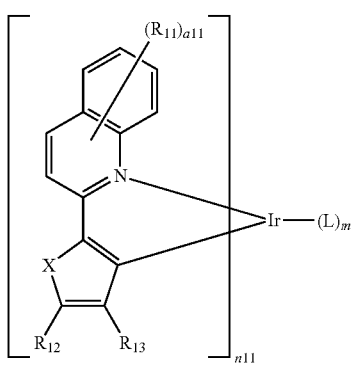

FORMULA 1

In Formula 1, $R_{11}$ may be selected from a hydrogen atom, a deuterium atom, a halogen atom, a substituted or unsubstituted $C_1$-$C_{30}$ alkyl group, a substituted or unsubstituted a substituted or unsubstituted $C_6$-$C_{20}$ aryl group, and a substituted or unsubstituted $C_2$-$C_{20}$ heteroaryl group.

For example, in Formula 1, $R_{11}$ may be selected from, but not limited to, i) a phenyl group, a biphenyl group, a pentalenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group; and ii) a phenyl group, a biphenyl group, a pentalenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridinyl group, a pyrazinyl group, a pyrimidinyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a. a phenyl group, a naphthyl group, an anthryl group, a fluorenyl group, a dimethylfluorenyl group, a diphenylfluorenyl group, a carbazolyl group, a phenyl carbazolyl group, a pyridyl group, a pyrimidyl group, a pyrazinyl group, a pyridazinyl group, a triazinyl group, a quinolyl group, and an isoquinolyl group, each substituted with at least one selected from i. a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, and a $C_1$-$C_{60}$ alkyl group;

ii. a $C_1$-$C_{60}$ alkyl group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, and a phosphoric acid or a salt thereof;

iii. a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and iv. a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, $C_1$-$C_{60}$ alkyl group, a phenyl group, a naphthyl group, an anthryl group, a fluorenyl group, a dimethylfluorenyl group, a diphenylfluorenyl group, a carbazolyl group, a phenyl carbazolyl group, a pyridyl group, a pyrimidyl group, a pyrazinyl group, a pyridazinyl group, a triazinyl group, a quinolyl group, and an isoquinolyl group.

For example, in Formula 1, $R_{11}$ may be selected from, but not limited to, i) a phenyl group, a naphthyl group, a phenanthryl group, an anthryl group, a pyrenyl group, a chrysenyl group, a fluorenyl group, a pyridyl group, a pyrimidyl group, a triazinyl group, a quinolinyl group, an isoquinolinyl group, a carbazolyl group, a dibenzofuranyl group, and a dibenzothiophenyl group; and ii) a phenyl group, a naphthyl group, a phenanthryl group, an anthryl group, a pyrenyl group, a chrysenyl group, a fluorenyl group, a pyridyl group, a pyrimidyl group, a triazinyl group, a quinolinyl group, an isoquinolinyl group, a carbazolyl group, a dibenzofuranyl group, and a dibenzothiophenyl group, each substituted with at least one selected from
  a. a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, and a C1-C60 alkyl group;
  b. a $C_1$-$C_{60}$ alkyl group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, and a phosphoric acid or a salt thereof;
  c. a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group; and
  d. a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, $C_1$-$C_{60}$ alkyl group, a phenyl group, a naphthyl group, an anthryl group, a fluorenyl group, a dimethylfluorenyl group, a diphenylfluorenyl group, a carbazolyl group, a phenyl carbazolyl group, a pyridyl group, a pyrimidyl group, a pyrazinyl group, a pyridazinyl group, a triazinyl group, a quinolyl group, and an isoquinolyl group.

For example, in Formula 1, $R_{11}$ may be selected from, but not limited to,
i) a phenyl group, a naphthyl group, a phenanthryl group, and an anthryl group; and
ii) a phenyl group, a naphthyl group, a phenanthryl group, and an anthryl group, each substituted with at least one of
  a. a deuterium atom, —F, a cyano group, a nitro group, a methyl group, an ethyl group, an n-propyl group, an i-propyl group, an n-butyl group, an i-butyl group, and a t-butyl group;
  b. a phenyl group, a naphthyl group, a phenanthryl group, and an anthryl group; and
  c. a phenyl group, a naphthyl group, a phenanthryl group, and an anthryl group, each substituted with at least one of a deuterium atom, —F, a methyl group, an ethyl group, an n-propyl group, an i-propyl group, an n-butyl group, an i-butyl group, and a t-butyl group.

For example, in Formula 1, $R_{11}$ may be selected from, but not limited to, a phenyl group; and a phenyl group substituted with at least one of a deuterium atom, —F, a methyl group, an ethyl group, an n-propyl group, an i-propyl group, an n-butyl group, an i-butyl group, and a t-butyl group.

For example, in Formula 1, $R_{11}$ may be a phenyl group, but is not limited thereto.

In Formula 1, a11 denotes the number of $R_{11}$, and a11 may be an integer of 1 to 6. When a11 is an integer of 2 or greater, each $R_{11}$ may be identical to or different from each other.

For example, in Formula 1, a11 may be an integer of 1 or 2, but is not limited thereto.

In Formula 1, X may be an oxygen atom or a sulfur atom.

For example, in Formula 1, X may be a sulfur atom, but is not limited thereto.

In Formula 1, $R_{11}$ and $R_{13}$ may be each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, and —CO($Q_1$) (here, $Q_1$ is a substituted or unsubstituted $C_1$-$C_{30}$ alkyl group or a substituted or unsubstituted $C_6$-$C_{60}$ aryl group), wherein $R_{12}$ and $R_{13}$ may be optionally linked to each other and form a substituted or unsubstituted saturated ring or a substituted or unsubstituted unsaturated ring.

For example, in Formula 1, $R_{12}$ and $R_{13}$ may be each independently selected from a hydrogen atom, a deuterium atom, a halogen atom, a substituted or unsubstituted $C_1$-$C_{60}$ alkyl group, a substituted or unsubstituted $C_6$-$C_{60}$ aryl group, and a substituted or unsubstituted $C_2$-$C_{60}$ heteroaryl group, and —CO($Q_1$) (here, $Q_1$ is a substituted or unsubstituted a methyl group, a substituted or unsubstituted an ethyl group, a substituted or unsubstituted a phenyl group, a substituted or unsubstituted a naphthyl group, a substituted or unsubstituted a phenanthryl group, a substituted or unsubstituted an anthryl group, a substituted or unsubstituted a pyridyl group, a substituted or unsubstituted a pyrimidyl group, a substituted or unsubstituted a triazinyl group, or a substituted or unsubstituted a carbazolyl group), wherein $R_{12}$ and $R_{13}$ may be optionally linked to each other and form a substituted or unsubstituted $C_6$-$C_{20}$ aromatic ring or a substituted or unsubstituted $C_6$-$C_{20}$ heteroaromatic ring, but are not limited thereto.

For example, in Formula 1, $R_{12}$ and $R_{13}$ may be each independently selected from
  a hydrogen atom, a deuterium atom, —F, a cyano group, and a nitro group;
  a methyl group, an ethyl group, an n-propyl group, an i-propyl group, an n-butyl group, an i-butyl group, and a t-butyl group, each substituted with at least one of a hydrogen atom, a deuterium atom, —F, a cyano group, and a nitro group; and
  a phenyl group, a naphthyl group, a phenanthryl group, an anthryl group, a pyridyl group, a pyrimidyl group, a triazinyl group, a quinolinyl group, and an isoquinolinyl group, each substituted with at least one of a hydrogen atom, a deuterium atom, —F, a cyano group, a nitro group, a methyl group, and an ethyl group, wherein $R_{12}$ and $R_{13}$ may be optionally linked to each other and form a substituted or unsubstituted $C_6$-$C_{20}$ aromatic ring or a substituted or unsubstituted $C_1$-$C_{20}$ heteroaromatic ring, but are not limited thereto.

For example, in Formula 1, $R_{12}$ and $R_{13}$ may be each independently selected from a hydrogen atom, a deuterium atom, —F, and —$CF_3$, wherein $R_{12}$ and $R_{13}$ may be optionally linked to each other and form a $C_6$-$C_{20}$ aromatic ring, but are not limited thereto.

In Formula 1, n11 denotes the number of moieties represented by

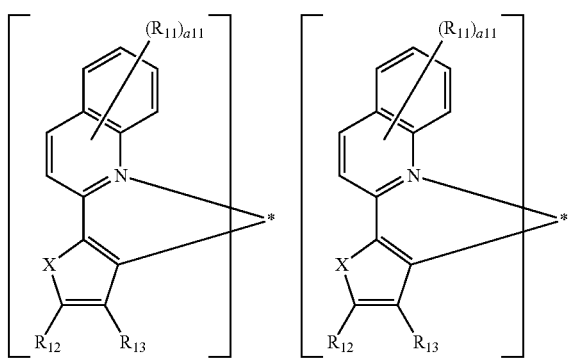

(here, * denotes a binding site with Ir of Formula 1), and n11 may be an integer of 1 to 3. When n11 is an integer of 2 or greater, the moieties represented by

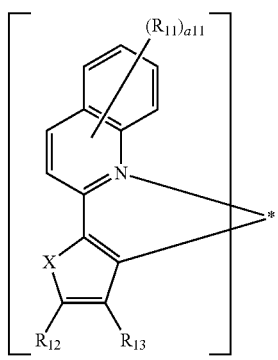

may be identical to or different from each other.

For example, in Formula 1, n11 may be an integer of 2 or 3, but is not limited thereto.

In Formula 1, L may be an organic ligand.

For example, in Formula 1, L may be selected from, but not limited to, a monodentate organic ligand, a bidnetate organic ligand, a tridentate organic ligand, and a tetradentate organic ligand.

For example, in Formula 1, L may be represented by one selected from Formulae 2a to 2e, but is not limited thereto:

FORMULA 2A

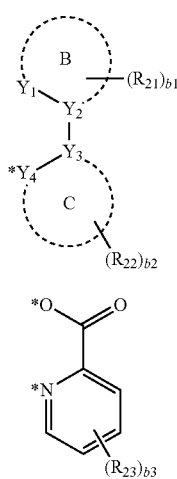

FORMULA 2B

FORMULA 2C

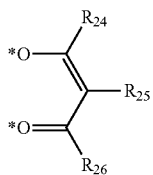

FORMULA 2D

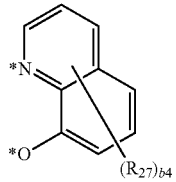

FORMULA 2F

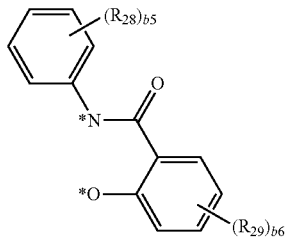

In Formulae 2a to 2e, $Y_1$ to $Y_4$ may be each independently C (carbon) or N (nitrogen), but are not limited thereto.

In Formula 2a to 2e, ring B and ring C may be each independently selected from, but not limited to, a $C_4$-$C_{20}$ alicyclic ring, a $C_2$-$C_{20}$ hetero alicyclic ring, a $C_6$-$C_{20}$ aromatic ring, and a $C_2$-$C_{20}$ heteroaromatic ring. Here, $R_{21}$ and $R_{22}$ each denote a substituent that is substituted to each of ring B and ring C, which are as described below.

For example, in Formulae 2a to 2e, ring B may be selected from, but not limited to, pyridine, pyrazine, pyrimidine, pyrrol, imidazol, oxazol, thiazol, isoquinolin, quinolin, benzoimidazol, benzooxazol, and benzothiazol.

For example, in Formulae 2a to 2e, ring C may be, but not limited to, a phenyl.

In Formulae 2a to 2e, $R_{21}$ to $R_{29}$ may be each independently selected from, but not limited to, a hydrogen atom, a deuterium atom, a halogen atom, a substituted or unsubstituted $C_1$-$C_{60}$ alkyl group, and a substituted or unsubstituted $C_6$-$C_{60}$ aryl group.

For example, $R_{21}$ to $R_{26}$ may be each independently selected from, but not limited to, a hydrogen atom, a deuterium atom, —F, a methyl group, a t-butyl group, and —$CF_3$.

In Formulae 2a to 2e, b1 to b6 may be each independently an integer of 0 to 4, but are not limited thereto.

For example, in Formulae 2a to 2e, b1 to b6 may be each independently an integer of 0 to 2, but are not limited thereto.

In Formulae 2a to 2e, * is a binding site with Ir.

For example, L may be represented by Formulae 2a to 2c, but is not limited thereto:

FORMULA 2A

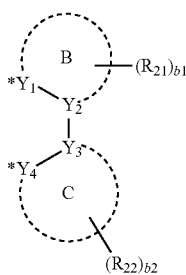

FORMULA 2B

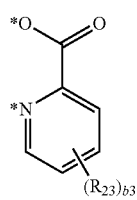

FORMULA 2C

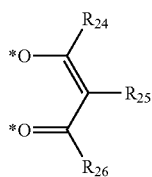

In Formulae 2a to 2c, $Y_1$ to $Y_4$ may be each independently C (carbon) or N (nitrogen);

ring B may be selected from pyridine, pyrazine, pyrimidine, pyrrol, imidazol, oxazol, thiazol, isoquinolin, quinolin, benzoimidazol, benzooxazol, and benzothiazol; ring B may be phenyl;

$R_{21}$ to $R_{26}$ may be each independently selected from a hydrogen atom, a deuterium atom, —F, a methyl group, a t-butyl group, and —$CF_3$;

b1 to b3 may be each independently an integer of 0 to 2; and

* is a binding site with Ir.

For example, L may be represented by one selected from Formulae 2g to 2i, but is not limited thereto:

FORMULA 2G

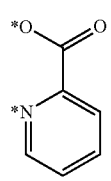

FORMULA 2H

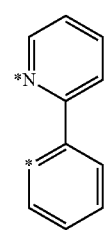

FORMULA 2I

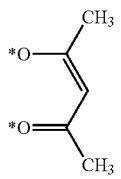

In Formulae 2g to 2i, * is a binding site with Ir.

In Formulae 2g to 2i, m denotes the number of L, and m may be an in integer of 0 to 2. When m is an integer of 2 or greater, each L may be identical to or different from each other.

For example, in Formula 1, m may be 0 or 1, but is not limited thereto.

In Formula 1, when a substituted or unsubstituted saturated ring or a substituted or unsubstituted unsaturated ring is formed as $R_{12}$ and $R_{13}$ are optionally linked to each other, the organic metal compound may be represented by Formula 1a below, but is not limited thereto:

FORMULA 1A

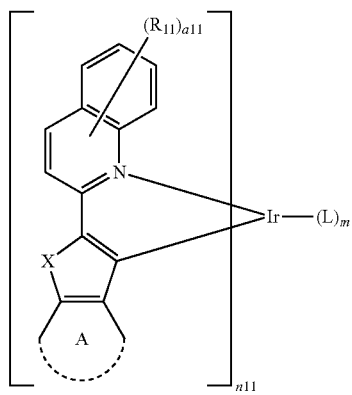

In Formula 1a, ring A may be a substituted or unsubstituted $C_6$-$C_{20}$ aromatic ring or a substituted or unsubstituted $C_2$-$C_{20}$ heteroaromatic ring, and $R_{11}$, a11, X, n11, L, and m may be referred to the descriptions stated above, but are not limited thereto.

For example, in Formula 1a, ring A may be, but not limited to, a $C_6$-$C_{20}$ aromatic ring substituted with at least one of a hydrogen atom, a deuterium atom, —F, a cyano group, a nitro group, a methyl group, an ethyl group, and —$CF_3$ or a $C_2$-$C_{20}$ heteroaromatic ring substituted with at least one of a hydrogen atom, a deuterium atom, —F, a cyano group, a nitro group, a methyl group, an ethyl group, and —$CF_3$.

For example, in Formula 1a, ring A may be, but not limited to, a $C_6$-$C_{20}$ aromatic ring or a $C_2$-$C_{20}$ heteroaromatic ring.

For example, in Formula 1a, ring A may be selected from, but not limited to, phenyl, naphthalene, anthracene, pyridine, pyrazine, and triazine.

For example, in Formula 1a, ring A may be selected from, but not limited to, phenyl, naphthalene, and anthracene.

The organic metal compound represented by Formula 1 may be represented by one selected from Formulae 1b to 1f, but is not limited thereto:

FORMULA 1B

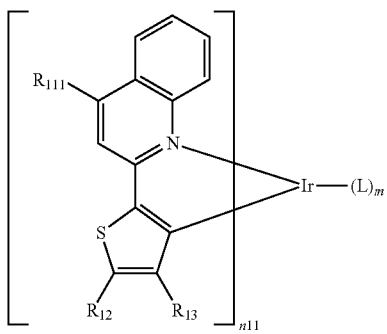

FORMULA 1C

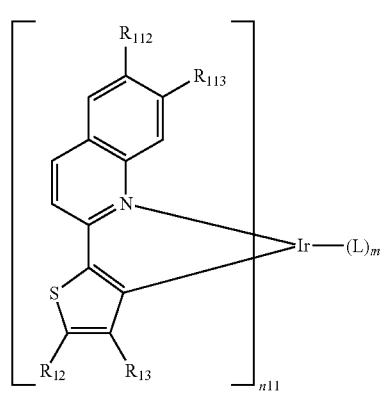

FORMULA 1D

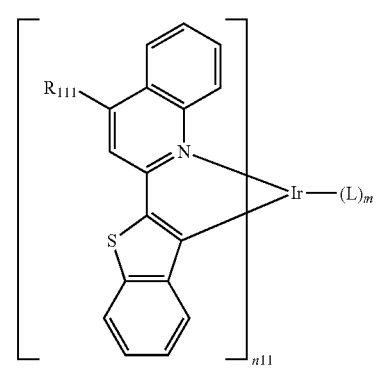

FORMULA 1E

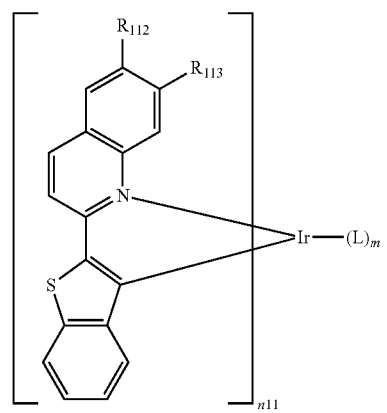

In Formulae 1b to 1e, $R_{111}$ to $R_{113}$ may be each independently selected from i) a phenyl group; and ii) a phenyl group substituted with at least one of a deuterium atom, —F, a methyl group, an ethyl group, an n-propyl group, an i-propyl group, an n-butyl group, an i-butyl group, and a t-butyl group, $R_{12}$ and $R_{13}$ are each independently selected from a hydrogen atom, a deuterium atom, —F, and —$CF_3$, n11 is an integer of 2 or 3, L is represented by one selected from Formulae 2g to 2i:

FORMULA 2G

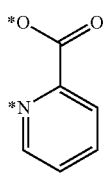

FORMULA 2H

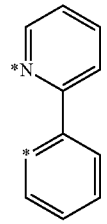

FORMULA 2I

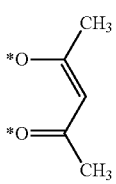

In Formulae 2g to 2i,

* is a binding site with Ir, and m is 3-n11.

The organic metal compound represented by Formula 1 may be one selected from Compounds 1 to 9 below, but is not limited thereto:

101

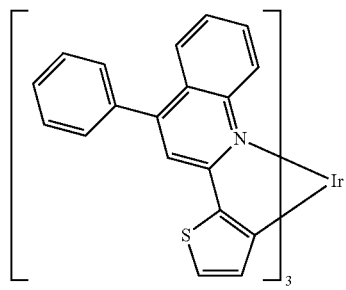

102

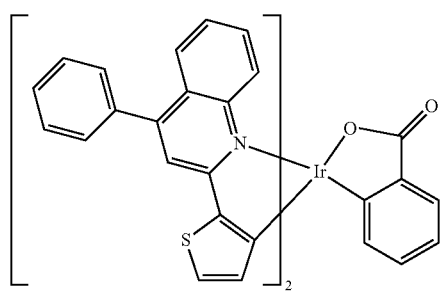

-continued

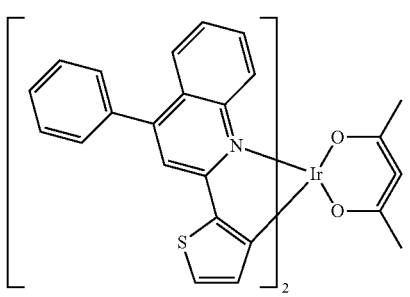
103

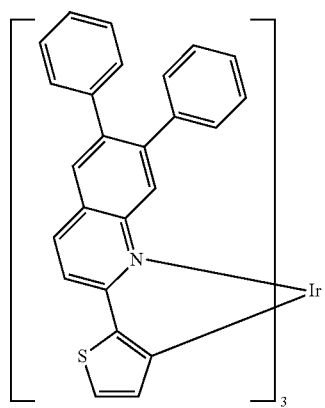
104

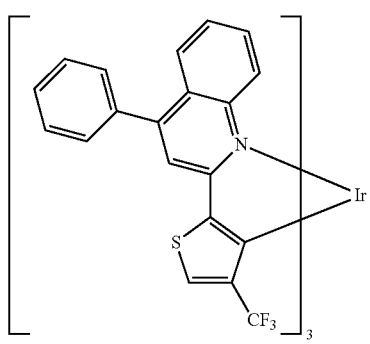
105

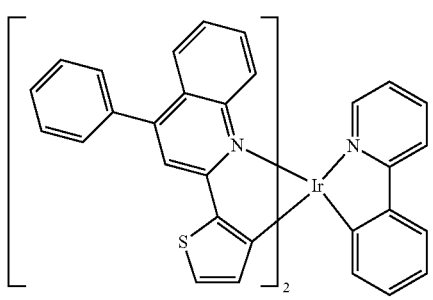
106

-continued

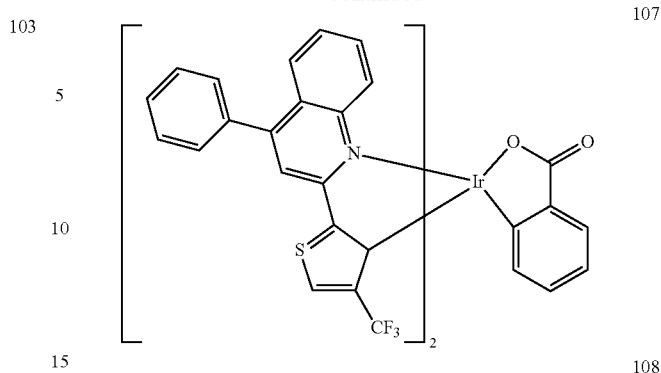
107

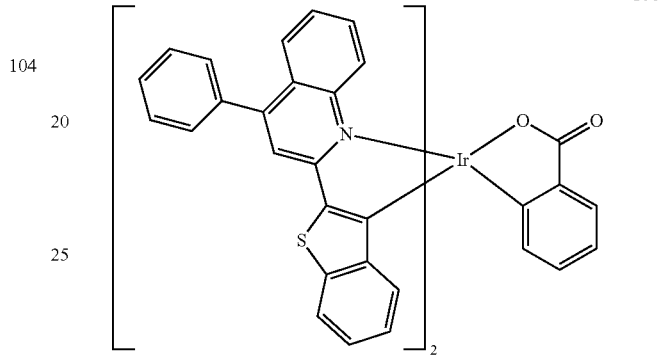
108

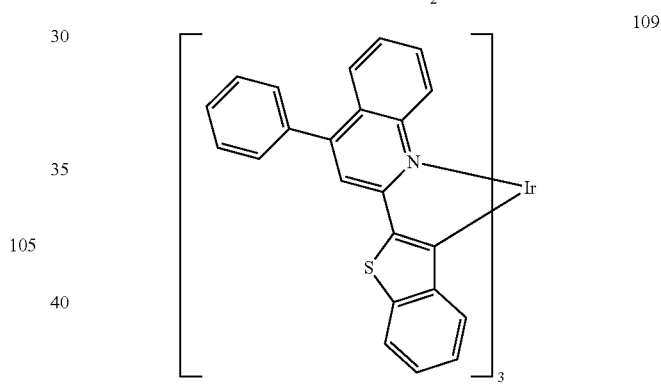
109

In some embodiments, the organic metal compound represented by Formula 1 may provide an OLED having a high color purity by shifting emission color toward a long wavelength as a quinolin is substituted by a phenyl group.

When the organic metal compound represented by Formula 1 includes thiophene, an electron trapping ability of the compound increases, and thus an EML may form a large amount of exitons. Therefore, an OLED including the organic metal compound represented by Formula 1 have a high efficiency and a low driving voltage.

Also, an exiton formation ration in the EML may be increased when the compound represented by Formula 1 is combined with a compound represented by Formula 3. Therefore, an OLED including both the compound represented by Formula 1 and the compound represented by Formula 3 may have a high efficiency and a low driving voltage.

In addition, when the amine-based compound represented by Formula 4 is further included in a hole transporting region, an amount of hole that are transported to the EML increases, and thus the OLED may have a lowered driving voltage and an increased efficiency.

In some embodiments, the EML 133 may include at least one selected from compounds represented by Formula 3:

FORMULA 3

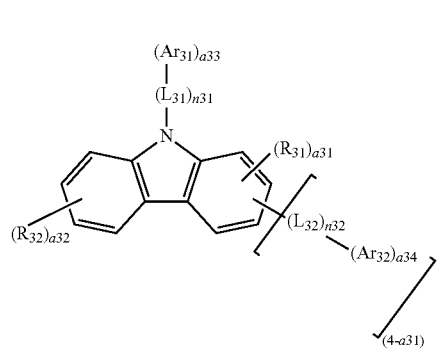

In Formula 3, $Ar_{31}$ and $Ar_{32}$ may be each independently selected from
i) a $C_1$-$C_{60}$ alkyl group;
ii) a $C_6$-$C_{60}$ aryl group and a $C_2$-$C_{60}$ heteroaryl group;
iii) a $C_6$-$C_{60}$ aryl group and a $C_2$-$C_{60}$ heteroaryl group a deuterium atom, each substituted with at least one of a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 3, $Ar_{31}$ and $Ar_{32}$ may be each independently selected from, but not limited to,
i) a methyl group, an ethyl group, an n-propyl group, an iso-propyl group, an n-butyl group, a sec-butyl group, an iso-butyl group, and a tert-butyl group;
ii) a phenyl group, a biphenyl group, a pentalenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridyl group, a pyrazinyl group, a pyrimidyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group; and
iii) a phenyl group, a biphenyl group, a pentalenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a benzofluorenyl group, a cyclopentaphenanthrenyl group, an indenofluorenyl group, an indenopyrenyl group, an indenophenanthrenyl group, an indenoanthracenyl group, an indenochrysenyl group, a benzodihydroanthracenyl group, a pyrrolyl group, an imidazolyl group, a pyrazolyl group, a pyridyl group, a pyrazinyl group, a pyrimidyl group, a pyridazinyl group, an isoindoyl group, an indoyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thienyl group, a benzothienyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and a substituted or unsubstituted $C_2$-$C_{60}$ heteroaryl group.

For example, in Formula 3, $Ar_{31}$ and $Ar_{32}$ may be each independently selected from, but not limited to,
i) a methyl group, an ethyl group, and a tert-butyl group;
ii) a phenyl group, a biphenyl group, a naphthyl group, a phenanthryl group, an anthryl group, a pyrenyl group, a chrysenyl group, a fluorenyl group, a benzofluorenyl group, a spiro-fluorenyl group, a fluoranthenyl group, a triphenylenyl group, a pyrrolyl group, an imidazolyl group, a pyrazolyl group, a pyridyl group, a pyrazinyl group, a pyrimidyl group, a pyridazinyl group, a triazinyl group, an indoyl group, a quinolinyl group, an isoquinolinyl group, a carbazolyl group, a furanyl group, a benzofuranyl group, a dibenzofuranyl group, a thienyl group, a benzothienyl group, and a dibenzothiophenyl group; and
iii) a phenyl group, a biphenyl group, a naphthyl group, a phenanthryl group, an anthryl group, a pyrenyl group, a chrysenyl group, a fluorenyl group, a benzofluorenyl group, a spiro-fluorenyl group, a fluoranthenyl group, a triphenylenyl group, a pyrrolyl group, an imidazolyl group, a pyrazolyl group, a pyridyl group, a pyrazinyl group, a pyrimidyl group, a pyridazinyl group, a triazinyl group, an indoyl group, a quinolinyl group, an isoquinolinyl group, a carbazolyl group, a furanyl group, a benzofuranyl group, a dibenzofuranyl group, a thienyl group, a benzothienyl group, and a dibenzothiophenyl group, each substituted with at least one selected from
a. a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, and a $C_1$-$C_{60}$ alkyl group;
b. a $C_1$-$C_{60}$ alkyl group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, and a phosphoric acid or a salt thereof;
c. a $C_6$-$C_{60}$ aryl group and a $C_2$-$C_{60}$ heteroaryl group; and
d. a $C_6$-$C_{60}$ aryl group and a $C_2$-$C_{60}$ heteroaryl group, each substituted with a $C_1$-$C_{60}$ alkyl group substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, and a phosphoric acid or a salt thereof.

For example, in Formula 3, $Ar_{31}$ and $Ar_{32}$ may be each independently selected from, but not limited to,
i) a methyl group;
ii) a phenyl group, a biphenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridyl group, a pyrazinyl group, a pyrimidyl group, a pyridazinyl group, an indoyl group, a quinolinyl group, an isoquinolinyl group, a carbazolyl group, a furanyl group, a benzofuranyl group, a thienyl group, a benzothienyl group, a triazinyl group, a dibenzofuranyl group, and a dibenzothiophenyl group;
iii) a phenyl group, a biphenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridyl group, a pyrazinyl group, a pyrimidyl group, a pyridazinyl group, an indoyl group, a quinolinyl group, an isoquinolinyl group, a carbazolyl group, a furanyl group, a benzofuranyl group, a thienyl group, a benzothienyl group, a triazinyl group, a dibenzofuranyl group, and a dibenzothiophenyl group, each substituted with at least one of a deuterium atom, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-butoxy group;
iv) a phenyl group, a biphenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridyl group, a pyrazinyl group, a pyrimidyl group, a pyridazinyl group, an indoyl group, a quinolinyl group, an isoquinolinyl group, a carbazolyl group, a furanyl group, a benzofuranyl group, a thienyl group, a benzothienyl group, a triazinyl group, a dibenzofuranyl group, and a dibenzothiophenyl group, each substituted with at least one of a phenyl group, a naphthyl group, a pyridyl group, a pyrimidyl group, and a triazinyl group; and
v) a phenyl group, a biphenyl group, a naphthyl group, a fluorenyl group, a spiro-fluorenyl group, an anthryl group, a fluoranthenyl group, a triphenylenyl group, a pyrenyl group, a chrysenyl group, a benzofluorenyl group, a pyrrolyl group, an imidazolyl group, a pyrazolyl group, a pyridyl group, a pyrazinyl group, a pyrimidyl group, a pyridazinyl group, an indoyl group, a quinolinyl group, an isoquinolinyl group, a carbazolyl group, a furanyl group, a benzofuranyl group, a thienyl group, a benzothienyl group, a triazinyl group, a dibenzofuranyl group, and a dibenzothiophenyl group, each substituted with at least one of a phenyl group, a naphthyl group, a pyridyl group, a pyrimidyl group, and a triazinyl group, each substituted with at least one of a deuterium atom, —F, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, and a tert-butoxy group.

For example, in Formula 3, $Ar_{31}$ and $Ar_{32}$ may be each independently selected from, but not limited to, a methyl group, a phenyl group, a biphenyl group, and a naphthyl group.

In Formula 3, $L_{31}$ and $L_{32}$ may be each independently selected from,
i) a $C_6$-$C_{60}$ arylene group and a $C_2$-$C_{60}$ heteroarylene group; and
ii) a $C_6$-$C_{60}$ arylene group and a $C_2$-$C_{60}$ heteroarylene group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 3, $L_{21}$ and $L_{32}$ may be each independently selected from, but not limited to,
i) a phenylene group, a pentalenylene group, an indenylene group, a naphthylene group, an azulenylene group, a heptalenylene group, an indacenylene group, an acenaphtylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindoylene group, an indoylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, and a benzocarbazolylene group; and ii) a phenylene group, a pentalenylene group, an indenylene group, a naphthylene group, an azulenylene group, a heptalenylene group, an indacenylene group, an acenaphtylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindoylene group, an indoylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, and a benzocarbazolylene group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 3, $L_{31}$ and $L_{32}$ may be each independently selected from, but not limited to, i) a phenylene group, a naphthylene group, a fluorenylene group, a pyridinylene group, a pyrazinylene group, a pyrimidinylene group, a pyridazinylene group, a carbazolylene group, a triazolylene group, a dibenzofuranylene group, and a dibenzothiophenylene group; and ii) a phenylene group, a naphthylene group, a fluorenylene group, a pyridinylene group, a pyrazinylene group, a pyrimidinylene group, a pyridazinylene group, a carbazolylene group, a triazolylene group, a dibenzofuranylene group, and a dibenzothiophenylene group, each substituted with at least one of a methyl group, an ethyl group, a t-butyl group, a phenyl group, a biphenyl group, a naphthyl group, a pyridyl group, a pyrimidyl group, and a triazinyl group.

For example, in Formula 3, $L_{31}$ and $L_{32}$ may be each independently selected from, but not limited to, i) a pyridinylene group, a pyrazinylene group, a pyrimidinylene group, a pyridazinylene group, a carbazolylene group, a triazolylene group, a dibenzofuranylene group, and a dibenzothiophenylene group; and ii) a pyridinylene group, a pyrazinylene group, a pyrimidinylene group, a pyridazinylene group, a carbazolylene group, a triazolylene group, a dibenzofuranylene group, and a dibenzothiophenylene group, each substituted with at least one of a methyl group, a phenyl group, a biphenyl group, and a naphthyl group.

In Formula 3, n31 denotes the number of $L_{31}$, and n31 may be an integer of 0 to 3. When n31 is an integer of 2 or greater, each $L_{31}$ may be identical to or different from each other.

For example, in Formula 3, n31 may be an integer of 0 or 1, but is not limited thereto.

In Formula 3, n32 denotes the number of $L_{32}$, and n32 may be an integer of 0 to 3. When n32 is an integer of 2 or greater, each $L_{32}$ may be identical to or different from each other.

For example, in Formula 3, n32 may be an integer of 0 or 1, but is not limited thereto.

In Formula 3, $R_{31}$ and $R_{32}$ may be each independently selected from a hydrogen atom, a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group.

For example, in Formula 3, $R_{31}$ and $R_{32}$ may be each independently selected from, but not limited to, a hydrogen atom, a deuterium atom, a halogen atom, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, a tert-butoxy group, a phenyl group, a naphthyl group, a pyridyl group, a pyrimidyl group, and a triazinyl group.

The compound represented by Formula 3 may be a compound represented by Formula 3A, but is not limited thereto:

FORMULA 3A

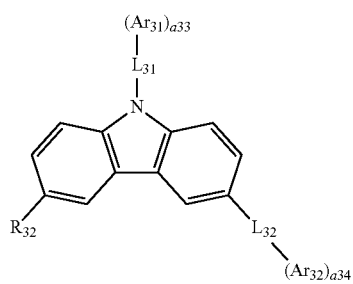

In Formula 3a, $Ar_{31}$ and $Ar_{32}$ are each independently selected from a methyl group, a phenyl group, a biphenyl group, and a naphthyl group;

$L_{31}$ and $L_{32}$ are each independently selected from i) a pyridinylene group, a pyrazinylene group, a pyrimidinylene group, a pyridazinylene group, a carbazolylene group, a triazolylene group, a dibenzofuranylene group, and a dibenzothiophenylene group; and ii) a pyridinylene group, a pyrazinylene group, a pyrimidinylene group, a pyridazinylene group, a carbazolylene group, a triazolylene group, a dibenzofuranylene group, and a dibenzothiophenylene group, each substituted with at least one of a methyl group, a phenyl group, a biphenyl group, and a naphthyl group;

$R_{32}$ is selected from a hydrogen atom, a deuterium atom, a halogen atom, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, a tert-butoxy group, a phenyl group, a naphthyl group, a pyridyl group, a pyrimidyl group, and a triazinyl group; and a33 and a34 are each independently an integer of 0 to 2.

In some embodiments, the carbazole-based compound represented by Formula 3 may be a compound represented by Formula 3B, but is not limited thereto:

FORMULA 3B

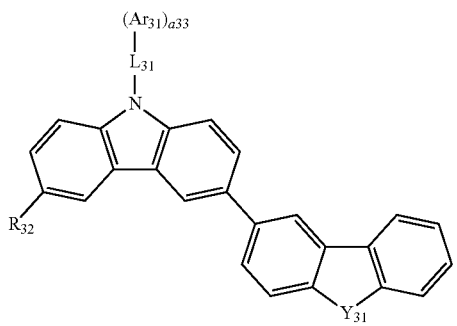

In Formula 3b, $Y_{31}$ is selected from an oxygen atom, a sulfur atom, $N(Ar_{321})$, and $C(Ar_{322})(Ar_{323})$;

$Ar_{31}$, $Ar_{321}$, $Ar_{322}$, and $Ar_{323}$ are each independently selected from a methyl group, a phenyl group, a biphenyl group, and a naphthyl group;

$L_{31}$ is selected from i) a pyridinylene group, a pyrazinylene group, a pyrimidinylene group, a pyridazinylene group, and a triazolylene group; and ii) a pyridinylene group, a pyrazinylene group, a pyrimidinylene group, a pyridazinylene group, and a triazolylene group, each substituted with at least one of a methyl group, a phenyl group, a biphenyl group, and a naphthyl group;

$R_{32}$ is selected from a hydrogen atom, a deuterium atom, a halogen atom, a cyano group, a nitro group, a methyl group, an ethyl group, an n-propyl group, an iso-propyl group, an n-butyl group, an iso-butyl group, a sec-butyl group, a tert-butyl group, a methoxy group, an ethoxy group, a tert-butoxy group, a phenyl group, a naphthyl group, a pyridyl group, a pyrimidyl group, and a triazinyl group; and a33 is an integer of 0 to 2.

In some embodiments, the compound represented by Formula 3 may be at least one selected from Compound 201 to 227 below, but is not limited thereto:

201

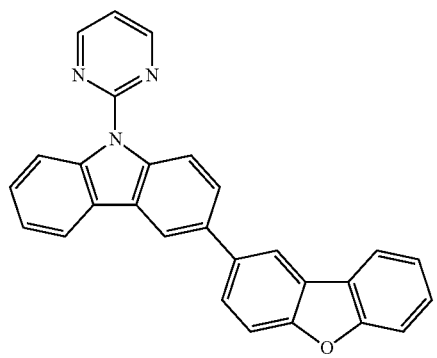

202

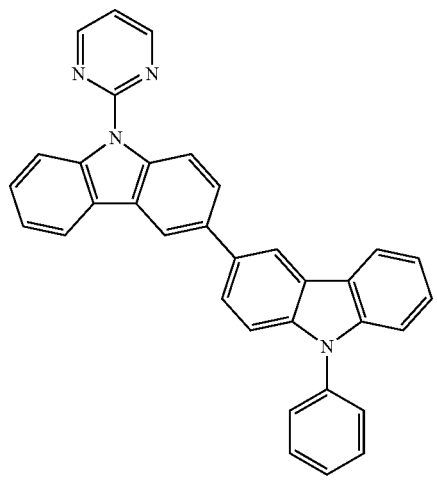

203

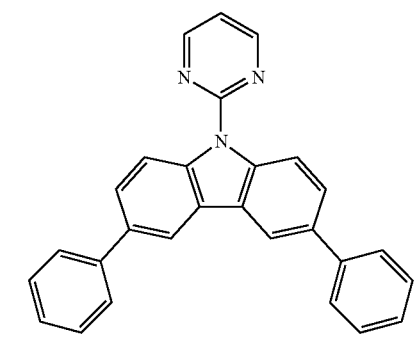

204
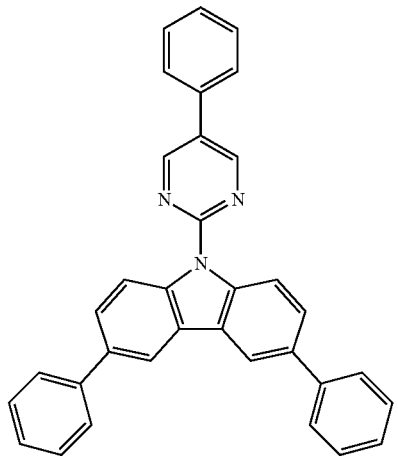
205
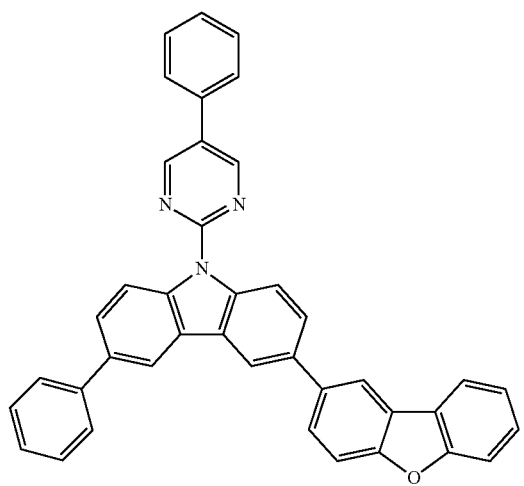
206
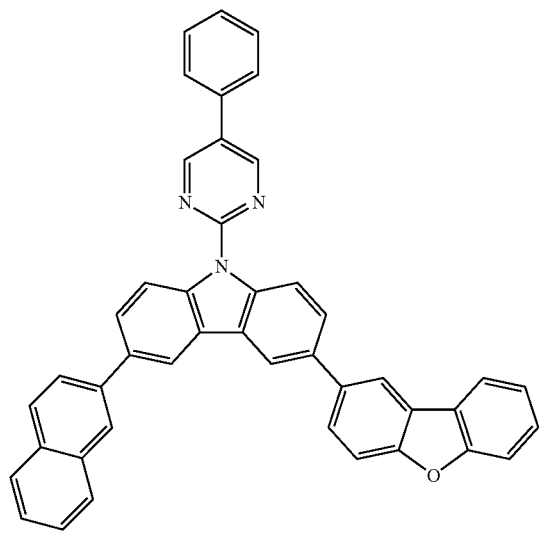
207
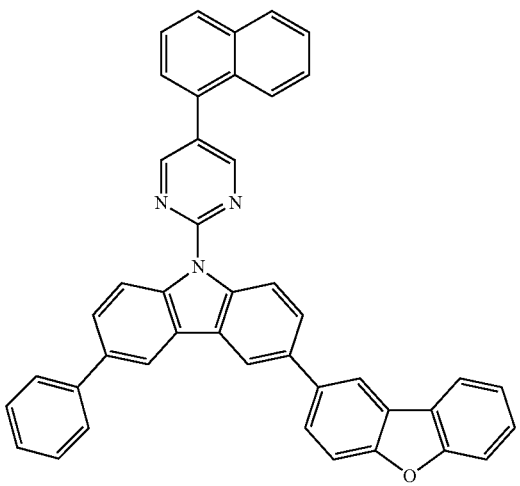
208
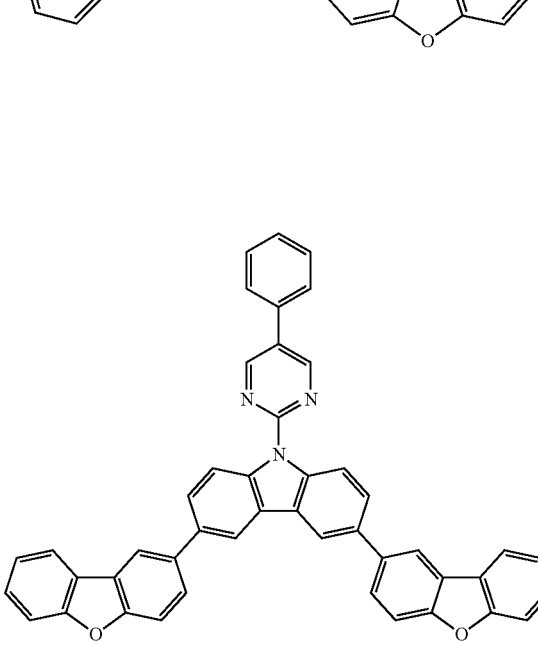
209
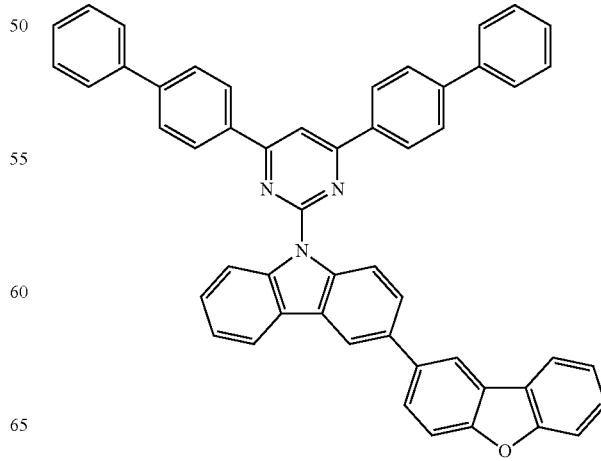

210
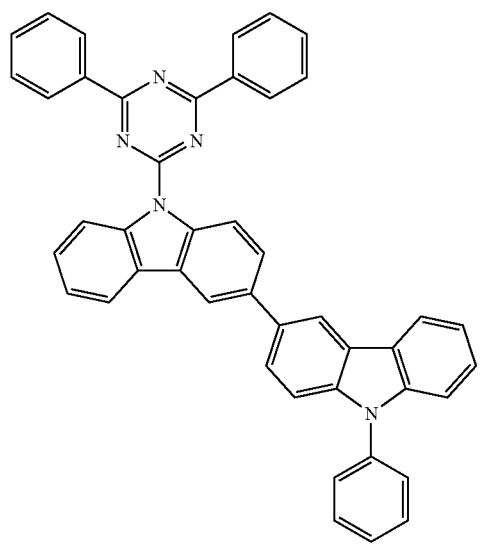
211
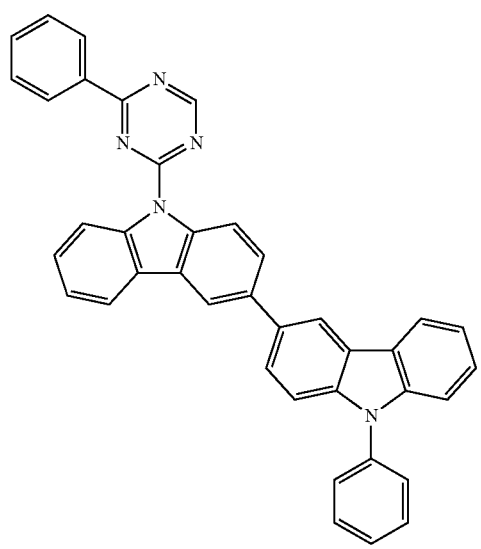
212
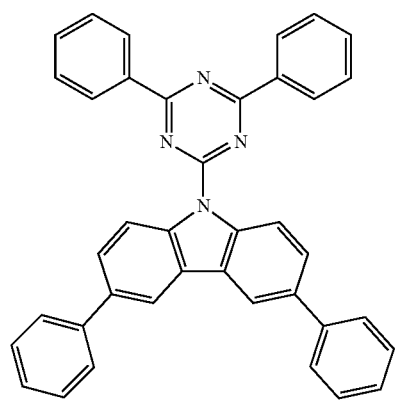
213
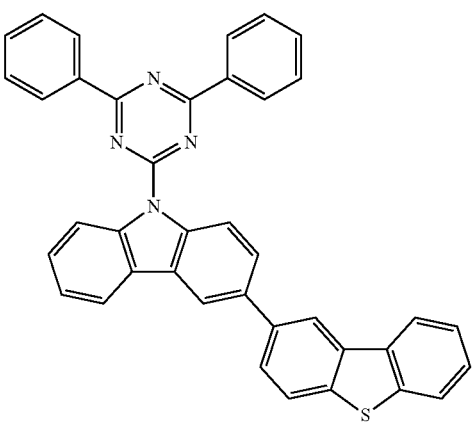
214
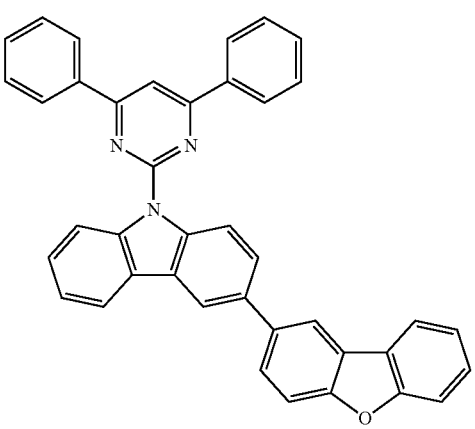
215
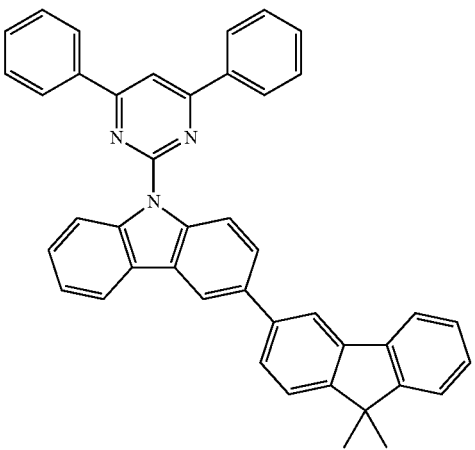

216
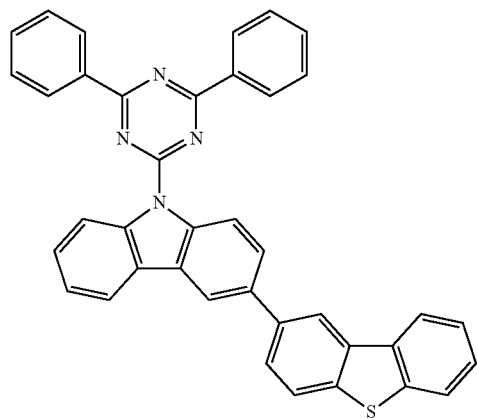
217
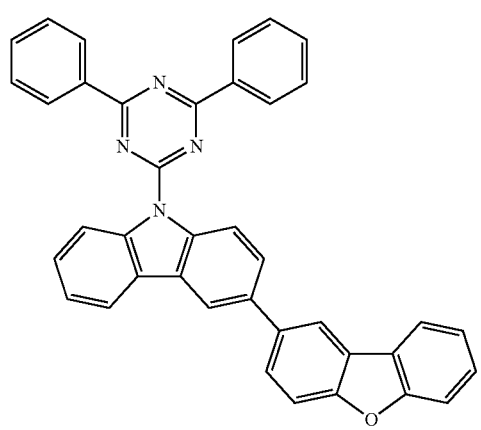
218
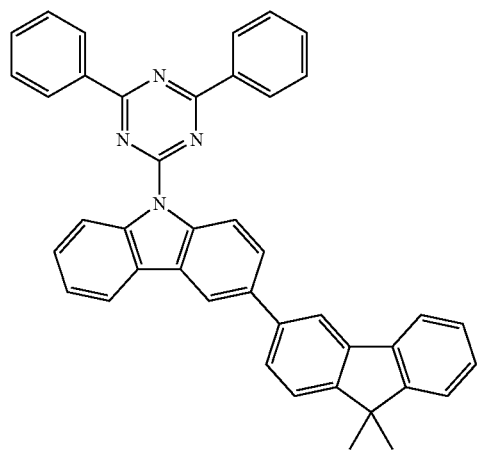
219
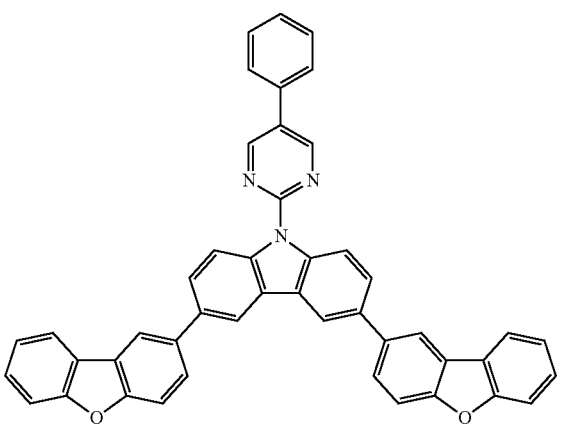
220
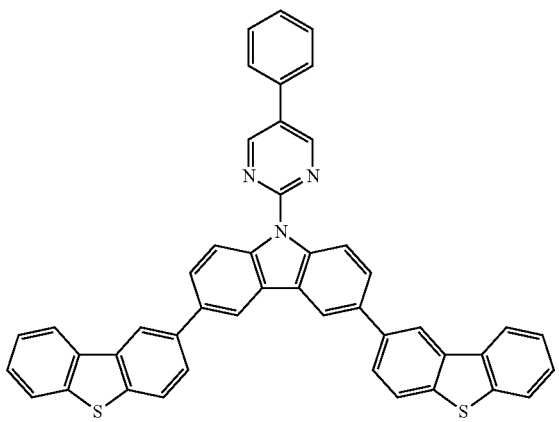
221
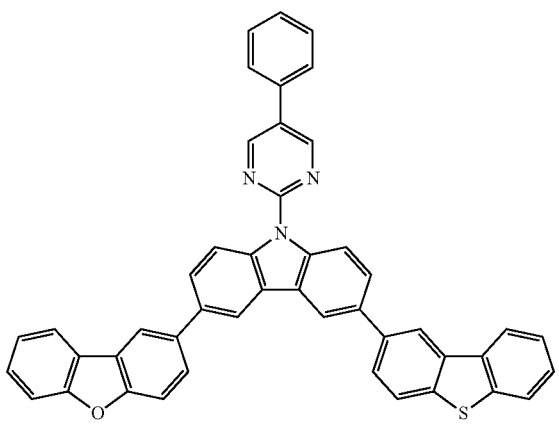

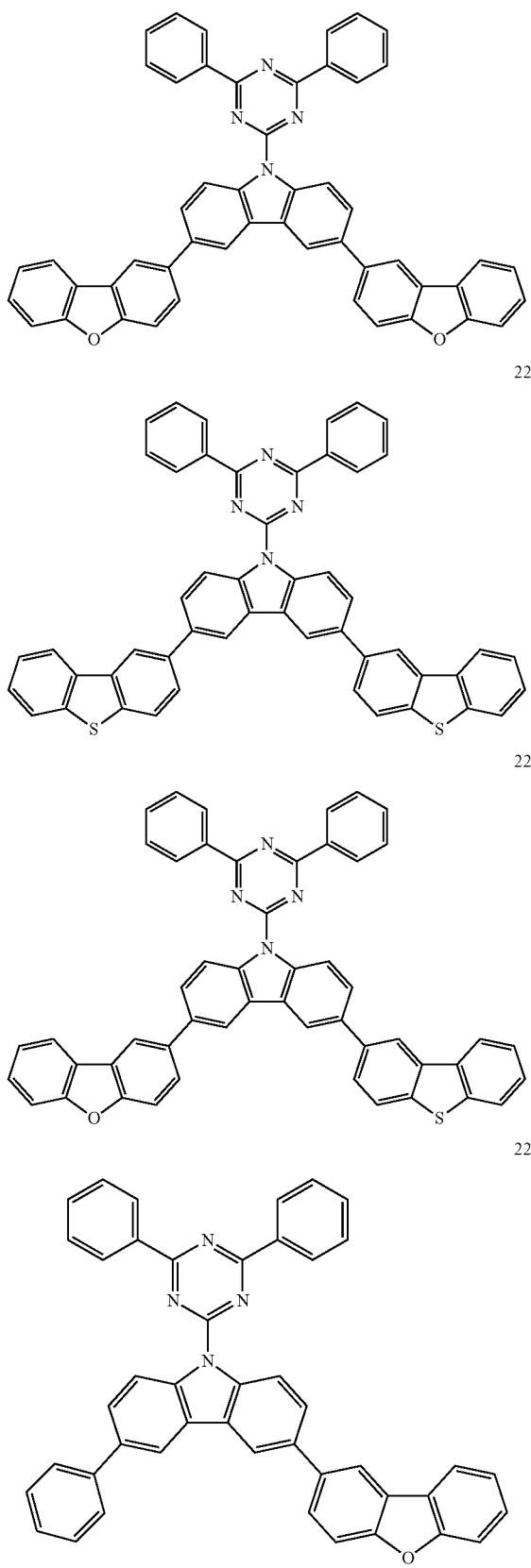

In some embodiments, the compound represented by Formula 1 may serve as a dopant. In some embodiments, the compound represented by Formula 1 may serve as a blue phosphorescent dopant. In some embodiments, the compound represented by Formula 1 may serve as a green phosphorescent dopant. In some embodiments, the compound represented by Formula 1 may serve as a red phosphorescent dopant.

In some embodiments, the compound represented by Formula 3 may serve as a host. In some embodiments, the compound represented by Formula 3 may serve as a blue host. In some embodiments, the compound represented by Formula 3 may serve as a green host. In some embodiments, the compound represented by Formula 3 may serve as a red host.

In some embodiments, the EML 133 may further include a known host and/or a known dopant.

When the OLED 100 is a full-color OLED, the EML 133 may be patterned as a red EML, a green EML, and a blue EML depending on a red sub-pixel, a green sub-pixel, and a sub-blue pixel.

In some embodiments, the EML 133 may have a multiple-layered structure, in which a red EML, a green EML, and a blue EML are stacked so as to emit white light, or the EML 133 may have a single-layered structure including all of a red light-emitting material, a green light-emitting material, and a blue light-emitting material. In some embodiments, the OLED 100 including the EML 133 may emit light in full-color by further including a red color filter, a green color filter, and a blue color filter.

When the EML 133 includes a host and a dopant, an amount of the dopant may be generally in a range of about 0.01 wt % to about 15 wt % based on 100 wt % of the EML 133, but is not limited thereto.

In some embodiments, a thickness of the EML 133 is in a rage of about 200 Å to about 700 Å. When a thickness of the EML 133 is within this range, excellent light-emitting properties may be obtained without a substantial increase in driving voltage.

In some embodiments, the electron transporting region is disposed on the EML 133.

In some embodiments, the electron transporting region includes at least one layer selected from the HBL, the ETL 134, and the EIL 135.

In some embodiments, the ETL 134 is formed on the EML 133 by vacuum deposition, spin coating, or casting. When the ETL 134 is formed by vacuum deposition or spin coating, the deposition and coating conditions vary depending on a used compound, but generally the conditions may be almost the same as the conditions for forming the HIL 131.

A material for forming the ETL 134 may be a known electron transporting material. Examples of the known electron transporting material include, but not limited to, quinoline derivatives, such as tris(8-quinolinolate)aluminum (Alq$_3$), 3-(biphenyl-4-yl)-5-(4-tert-butylphenyl)-4-phenyl-4H-1,2,4-triazole (TAZ), bis(2-methyl-8-quinolinolato-N1,O8)-(1,1'-biphenyl) (Balq), beryllium bis(benzoquinolin-10-olate) (Bebq$_2$), 9,10-di(naphthalene-2-yl)anthracene (DNA), Compound 401, Compound 402, and Bphen:

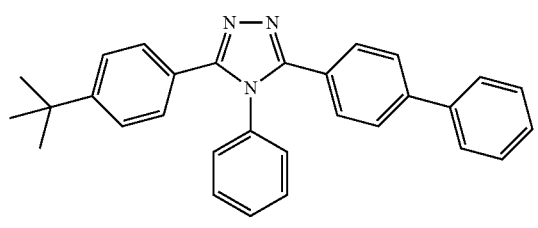

TAZ

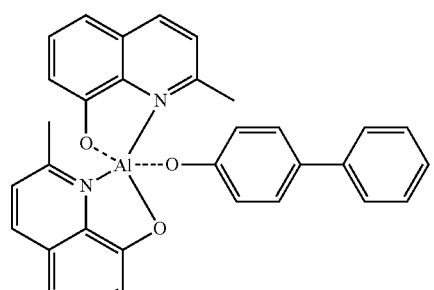

BAlq

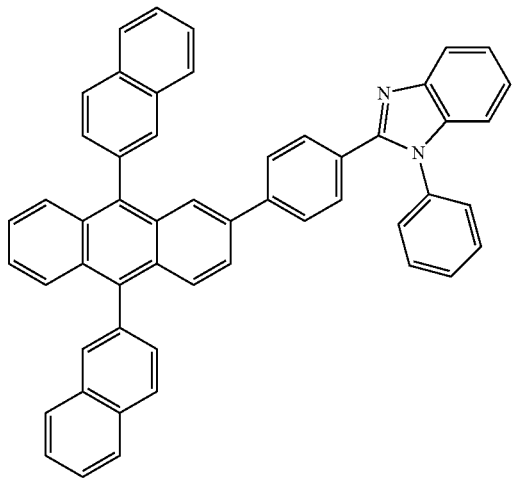

Compound 401

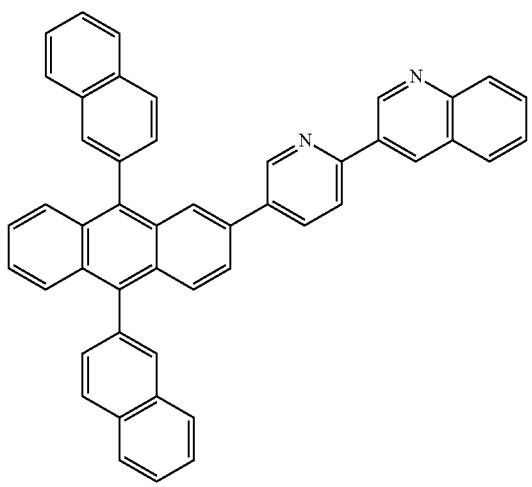

Compound 402

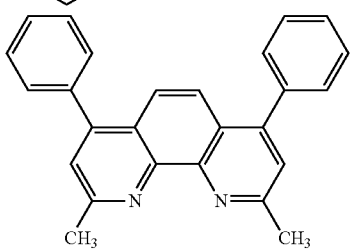

BCP

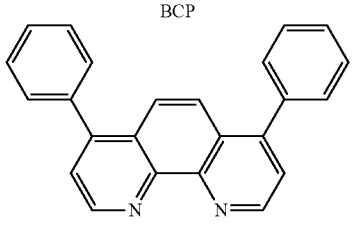

Bphen

In some embodiments, a thickness of the ETL 134 may be in a range of about 100 Å to about 1,000 Å, for example, in a range of about 150 Å to about 500 Å. When a thickness of the ETL 134 is within this range, satisfactory electron transporting properties may be obtained without a substantial increase in driving voltage.

In some embodiments, the ETL 134 may further include a metal-containing material in addition to a known electron transporting organic compound. The metal-containing material may include a Li-complex. Examples of the Li-complex may include a lithium quinolate (Liq) or Compound 203:

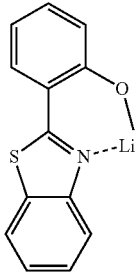

COMPOUND 203

Also, the EIL 135, which facilitates electron injection from a cathode, may be formed on the ETL 134, and a material for forming the EIL 135 is not particularly limited. For example, the material for forming the EIL 135 may include a known material for forming an EIL, such as LiF, NaCl, CsF, $Li_2O$, or BaO. The deposition condition of the EIL may vary according a used compound, but generally the condition may be almost the same as the condition for forming the HIL 131.

A thickness of the EIL 135 may be in a range of about 1 Å to about 100 Å, for example, in a range of about 3 Å to about 90 Å. When a thickness of the EIL 135 is within this range, satisfactory electron injecting properties may be obtained without a substantial increase in driving voltage.

Also, when a phosphorescent dopant is included in the EML 133, the HBL may be formed between the ETL 134 and the EML 133 by vacuum deposition, spin coating, casting or LB deposition to prevent triplet excitons or holes from being diffused to the ETL 134. When the HBL is formed by vacuum deposition or spin coating, the conditions thereof may vary according to a used compound, but generally the conditions may be almost the same as the condition for forming the HIL 131. The HBL may include a known HBL material. Examples of the known HBL material may include an oxadiazole derivative, a triazole derivative, and a phenanthroline derivative. For example, BCP may be used as a HBL material:

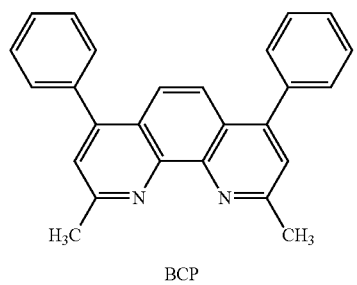 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1,000 Å, for example, in a range of about 30 Å to about 300 Å. When a thickness of the HBL is within this range, excellent hole blocking properties may be obtained without a substantial increase in driving voltage.

In some embodiments, the second electrode 140 is formed on the organic layer 130. In some embodiments, the second electrode 140 may be a cathode, which is an electron injection electrode. In some embodiments, a metal for forming the second electrode 140 may include a metal having low work function, such as metal, an alloy, an electric conducting compound, and a mixture thereof. In particular, the second electrode 140 may be formed as a thin film by using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type OLED, the second electrode 140 may be formed as a transparent electrode by using ITO or IZO.

Thus far, the OLED 100 has been described by referring to FIG. 1, but an OLED is not limited thereto.

As used herein, examples of the unsubstituted $C_1$-$C_{60}$ alkyl group (or a $C_1$-$C_{60}$ alkyl group) include linear or branched $C_1$-$C_{60}$ alkyl groups such as methyl, ethyl, propyl, isobutyl, sec-butyl, pentyl, iso-amyl, hexyl, and the like. Examples of the substituted $C_1$-$C_{60}$ alkyl group include a group, in which at least one hydrogen in the substituent $C_1$-$C_{60}$ alkyl group is substituted with one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, and a phosphoric acid or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxylic acid or a salt thereof, a sulfonic acid or a salt thereof, a phosphoric acid or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenyl carbazolyl group, a pyridyl group, a pyrimidyl group, a pyrazinyl group, a pyridazinyl group, a triazinyl group, a quinolyl group, and an isoquinolyl group; and —$N(Q_{11})(Q_{12})$ and —$Si(Q_{13})(Q_{14})(Q_{15})$ (here, $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or $C_2$-$C_{60}$ heteroaryl group)

As used herein, the unsubstituted $C_1$-$C_{60}$ alkoxy group (or a $C_1$-$C_{60}$ alkoxy group) has a formula of —OA (here, A is the unsubstituted $C_1$-$C_{60}$ alkyl group as described above) and examples thereof include methoxy, ethoxy, isopropyloxy, and the like. At least one hydrogen atom of the unsubstituted $C_1$-$C_{60}$ alkoxy group may be substituted with the same substituent as in the substituted $C_1$-$C_{60}$ alkyl group described above.

As used herein, the unsubstituted $C_2$-$C_{60}$ alkenyl group (or a $C_2$-$C_{60}$ alkenyl group) is interpreted to contain at least one carbon-carbon double bond in the center or at a terminal of the unsubstituted $C_2$-$C_{60}$ alkyl group. Examples of the unsubstituted $C_2$-$C_{60}$ alkenyl group include ethenyl, propenyl, butenyl, and the like. At least one hydrogen atom of the $C_2$-$C_{60}$ alkenyl group may be substituted with the same substituent as in the substituted $C_1$-$C_{60}$ alkyl group described above.

As used herein, the unsubstituted $C_2$-$C_{60}$ alkynyl group (or a $C_2$-$C_{60}$ alkynyl group) is interpreted to contain at least one carbon-carbon triple bond in the center or at a terminal of the $C_2$-$C_{60}$ alkyl group defined above. Examples of the unsubstituted $C_2$-$C_{60}$ alkynyl group include ethynyl, propynyl, and the like. At least one hydrogen atom of the unsubstituted $C_2$-$C_{60}$ alkynyl group may be substituted with the same substituent as in the substituted $C_1$-$C_{60}$ alkyl group described above.

As used herein, the unsubstituted $C_3$-$C_{30}$ cycloalkyl group indicates a monovalent group of a saturated cyclic hydrocarbon having 3 to 30 carbons. Examples of the unsubstituted $C_3$-$C_{30}$ cycloalkyl group include a cyclopropyl group, a cyclobutyl group, a cyclopentyl group, a cyclohexyl group, and a cyclooctyl group. At least one hydrogen atom of the unsubstituted $C_3$-$C_{30}$ cycloalkyl group may be substituted with the same substituent as in the substituted $C_1$-$C_{60}$ alkyl group described above.

As used herein, the unsubstituted $C_3$-$C_{30}$ cycloalkenyl group indicates a ring-type unsaturated hydrocarbon group including at least one carbon-carbon double bond, but not an aromatic ring. Examples of the unsubstituted $C_3$-$C_{30}$ cycloalkenyl group include a cyclopropenyl group, a cyclobutenyl group, a cyclopentenyl group, a cyclohexenyl group, a cycloheptenyl group, a 1,3-cyclohexadienyl group, a 1,4-cyclohexadienyl group, a 2,4-cycloheptadienyl group, and a 1,5-cyclooctadienyl group. At least one hydrogen atom of the unsubstituted $C_3$-$C_{30}$ cycloalkenyl group may be substituted with the same substituent as in the substituted $C_1$-$C_{60}$ alkyl group described above.

As used herein, the unsubstituted $C_6$-$C_{60}$ aryl group indicates a monovalent group having an aromatic carbocyclic system that has 6 to 60 carbon atoms and at least one aromatic ring and the unsubstituted $C_6$-$C_{60}$ arylene group indicates a divalent group having an aromatic carbocyclic system that has 6 to 60 carbon atoms and at least one aromatic ring. If the $C_6$-$C_{60}$ aryl group and the $C_6$-$C_{60}$ arylene group each independently have two or more aromatic rings, the rings may be fused with each other. At least one hydrogen atom of each of the unsubstituted $C_6$-$C_{60}$ aryl group and the unsubstituted $C_6$-$C_{60}$ arylene group may be substituted with the same substituent as in the substituted $C_1$-$C_{60}$ alkyl group described above.

As used herein, examples of the substituted or unsubstituted $C_6$-$C_{60}$ aryl group include, but not limited to, a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- and p-fluorophenyl group, and a dichlorophenyl group), a dicyanophenyl group, a trifluoromethoxyphenyl group, an o-, m-, and p-tolyl group, an o-, m- and p-cumenyl group, a mesityl group, a phenoxyphenyl group, an (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthracenyl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl, a pyranthrenyl group, and an ovalenyl group. Examples of the substituted $C_6$-$C_{60}$ aryl group may be easily understood with reference to the examples of the unsubstituted $C_6$-$C_{60}$ aryl group described above and the substituents of the substituted $C_1$-$C_{60}$ alkyl group. Examples of the substituted or unsubstituted $C_6$-$C_{60}$ arylene group may be easily understood with reference to the substituted or unsubstituted $C_6$-$C_{60}$ aryl group described above.

As used herein, the unsubstituted $C_2$-$C_{60}$ heteroaryl group indicates a monovalent group having at least one aromatic ring system including carbon rings and at least one hetero atom selected from the group consisting of N, O, P, and S as a ring-forming atom, and the unsubstituted $C_2$-$C_{60}$ heteroarylene group indicates a divalent group having at least one aromatic ring system including carbon rings and at least one hetero atom selected from the group consisting of N (nitrogen), O (oxygen), P (phosphorus), and S (sulfur). In this regard, if the $C_2$-$C_{60}$ heteroaryl group and the $C_2$-$C_{60}$ heteroarylene group each independently have two or more aromatic rings, the rings may be fused with each other. At least one hydrogen atom of each of the unsubstituted $C_2$-$C_{60}$ heteroaryl group and the unsubstituted $C_2$-$C_{60}$ heteroarylene group may be substituted with the same substituents as in the $C_1$-$C_{60}$ alkyl group described above.

As used herein, examples of the unsubstituted $C_2$-$C_{60}$ heteroaryl group include, but not limited to, a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ heteroarylene group may be easily understood with reference to the examples of the substituted or unsubstituted $C_2$-$C_{60}$ arylene group.

The substituted or unsubstituted $C_6$-$C_{60}$ aryloxy group has a formula of —$OA_2$, wherein $A_2$ is the substituted or unsubstituted $C_6$-$C_{60}$ aryl group as described above, and the substituted or unsubstituted $C_6$-$C_{60}$ arylthio group has a formula of —$SA_3$, wherein $A_3$ is the substituted or unsubstituted $C_6$-$C_{60}$ aryl group described above.

Hereinafter, an OLED according to an embodiment of the present invention will now be described in more detail with reference to the following examples. However, these examples are for illustrative purposes only and are not intended to limit the scope of the invention to the examples below.

SYNTHESIS EXAMPLE

Synthesis Example 1: Synthesis of Compound 101

Compound 101 was synthesized according to Reaction Scheme 1 below:

REACTION SCHEME 1

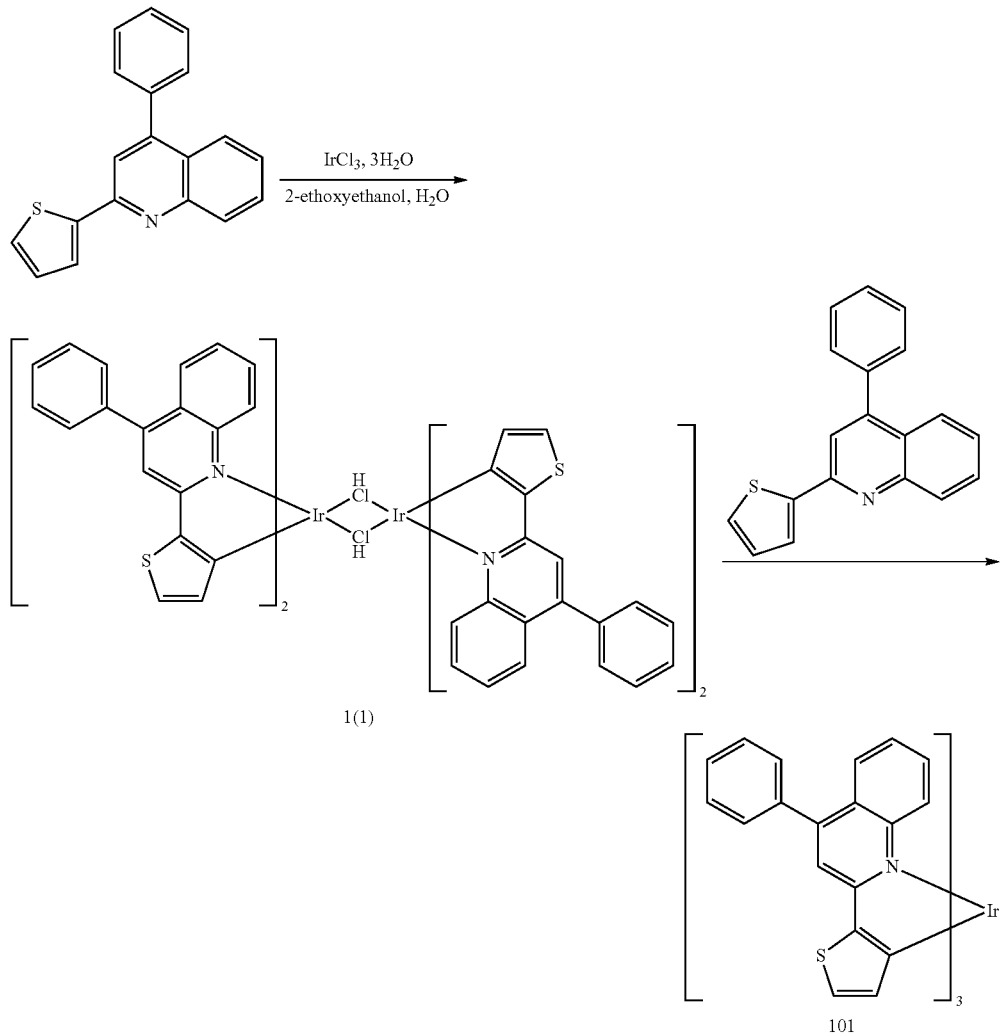

Synthesis of Intermediate 1(1)

9.6 g (33.44 mmol) of 2-(4-phenylnaphthalen-2-yl)thiophene was dissolved in 45 mL of 2-ethyoxyethanol, 2.4 g (7.6 mmol) of iridium chloride hydrate and 15 mL of distilled water were added thereto, and stirred for 20 hours at a temperature of 130° C. After the reaction was completed, the reaction solution was cooled to room temperature, and the precipitate was filtered. The precipitate was washed with methanol and dried under vacuum to obtain 5.03 g (3.12 mmol) of Intermediate 1(1) (yield: 41%).

Synthesis of Compound 101

1.68 g (1.05 mmol) of Intermediate 1(1), 0.70 g (2.44 mmol) of 2-(4-phenylnaphthalen-2-yl)thiophene, and 2.20 g (2.46 mmol) of $K_2CO_3$ were added into 30 mL of 2-ethyoxyethanol and stirred for 12 hours at a temperature of 130° C. After the reaction was completed, the reaction solution was cooled to room temperature, and the precipitate was filtered and washed with methanol. The precipitate was dissolved with dichloromethane and filtered with a silica short pad. Then, the filtered dichloromethane solution was boiled again, and methanol was added thereto in a small amount at a time to precipitate and obtain 1.46 g of Compound 101 (yield: 66%). The obtained Compound 101 was confirmed by using APCI-MS and $^1$H NMR.

$^1$H-NMR: 8.06 (3H), 7.97 (3H), 7.92 (3H), 7.79 (12H), 7.60 (3H), 7.51 (6H), 7.41 (3H), 7.25 (3H)

APCI-MS (m/z): 757 [M+] 1053.5

Synthesis Example 2: Synthesis of Compound 102

Compound 102 was synthesized in the same manner used in Synthesis Example 1, except that 0.29 g (2.44 mmol) of benzoic acid was used instead of 2-(4-phenylnaphthalen-2-yl)thiophene to obtain 1.35 g of Compound 102 (yield: 73%). The obtained Compound 102 was confirmed by using APCI-MS and $^1$H NMR.

$^1$H-NMR: 8.21 (2H), 8.06 (2H), 7.98 (2H), 7.90 (2H), 7.79 (5H), 7.66 (2H), 7.60 (2H), 7.51 (4H), 7.41 (2H), 7.26 (2H)

APCI-MS (m/z): 757[M+] 885.12

Synthesis Example 3: Synthesis of Compound 103

Compound 103 was synthesized in the same manner used in Synthesis Example 1, except that 0.28 g (2.44 mmol) of acetylacetonate was used instead of 2-(4-phenylnaphthalen-2-yl)thiophene to obtain 1.31 g of Compound 103 (yield: 71%). The obtained Compound 103 was confirmed by using APCI-MS and $^1$H NMR.

$^1$H-NMR: 8.55 (2H), 8.04 (4H), 7.79 (4H), 7.92 (2H), 7.69 (2H), 7.55 (4H), 7.51 (4H), 7.41 (2H), 7.26 (2H), 5.75 (1H), 4.06 (1H), 2.24 (2H).

APCI-MS (m/z): 757[M+] 878.1.

Synthesis Example 4: Synthesis of Compound 301

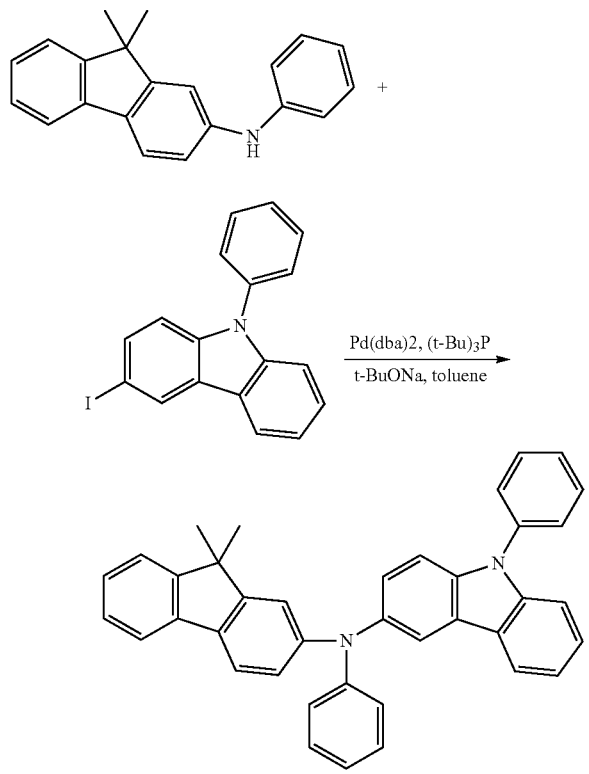

174 mg (0.614 mmol) of 9,9-dimethyl-N-phenyl-9H-fluorene-2-amine and 0.332 g (0.9 mmol) of 3-iodo-9-phenyl-9H-carbazole were dissolved in 10 mL of toluene, and 0.144 g (1.5 mmol) of t-BuONa, 0.018 g (0.02 mmol) Pd(dba)$_2$, and 0.004 to 0.006 g (0.02 to 0.03 mmol) of (t-Bu)$_3$P were added thereto and stirred for 6 hours at a temperature of 90° C.

The reaction mixture was extracted with 30 mL of ethylether for 3 times to collect an organic layer. The collected organic layer was dried by using magnesium sulfate, and the solvent was evaporated therefrom. The residue obtained therefrom was purified through a silica gel column chromatography to obtain 0.184 g of Compound 301 (yield: 57%). The obtained Compound 301 was confirmed by using $^1$H-NMR.

$^1$H-NMR (CDCl$_3$, 400 MHz) δ (ppm) 8.55 (1H), 7.94 (2H), 7.62 (1H), 7.58 (2H), 7.50 (2H), 7.45 (1H), 7.38 (3H), 7.28 (1H), 7.23 (2H), 6.81 (1H), 6.75 (4H), 6.63 (2H), 1.72 (6H)

Synthesis Example 5: Synthesis of Compound 201

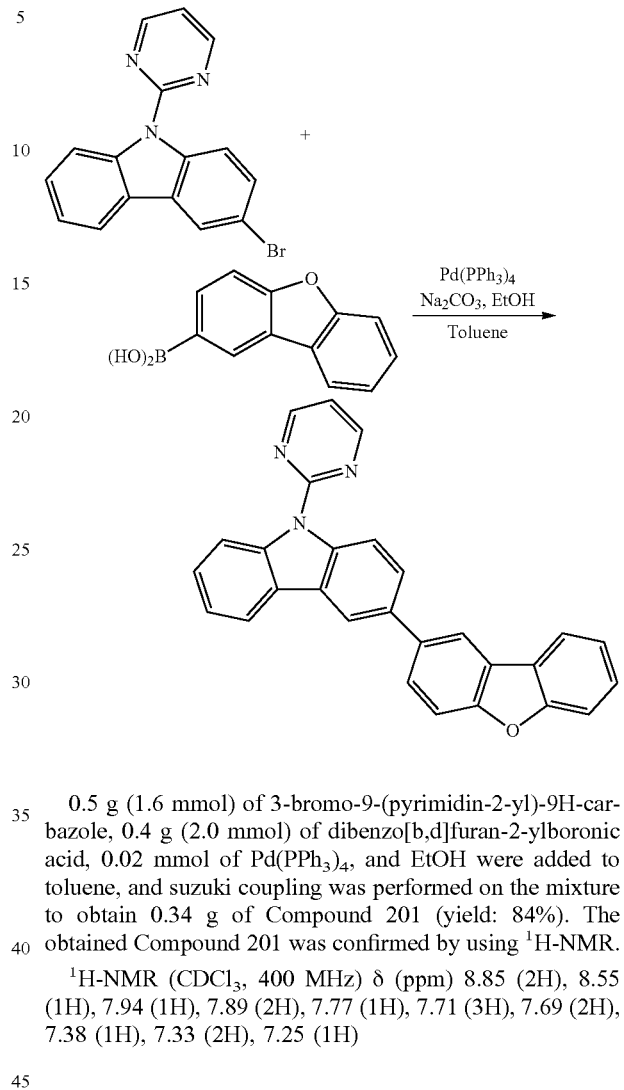

0.5 g (1.6 mmol) of 3-bromo-9-(pyrimidin-2-yl)-9H-carbazole, 0.4 g (2.0 mmol) of dibenzo[b,d]furan-2-ylboronic acid, 0.02 mmol of Pd(PPh$_3$)$_4$, and EtOH were added to toluene, and suzuki coupling was performed on the mixture to obtain 0.34 g of Compound 201 (yield: 84%). The obtained Compound 201 was confirmed by using $^1$H-NMR.

$^1$H-NMR (CDCl$_3$, 400 MHz) δ (ppm) 8.85 (2H), 8.55 (1H), 7.94 (1H), 7.89 (2H), 7.77 (1H), 7.71 (3H), 7.69 (2H), 7.38 (1H), 7.33 (2H), 7.25 (1H)

EXAMPLE 1

As an anode (Corning), a 15 Ω/cm$^2$ (1200 Å) ITO glass substrate was cut to a size of 50 mm×50 mm×0.7 mm, washed with ultrasonic waves in isopropyl alcohol and pure water for 5 minutes each, and then cleaned with UV for 30 minutes and exposed to ozone. The ITO glass substrate was mounted on a vacuum depositor.

2-TNATA was vacuum deposited on the ITO glass substrate to form a HIL having a thickness of 600 Å, and NPB was then deposited on the HIL to form a HTL having a thickness of 300 Å.

Compound 101 (as a dopant) and Compound 201 (as a host) were co-deposited on the HTL at a weight ratio of 2:98 to form an EML having a thickness of 400 Å. Then, Compound 401 was vacuum-deposited on the EML to form an ETL having a thickness of 300 Å, and LiF was deposited on the ETL to form an EIL having a thickness of 10 Å.

Al was deposited on the EIL, to form a second electrode having a thickness of 3,000 Å.

COMPOUND 401

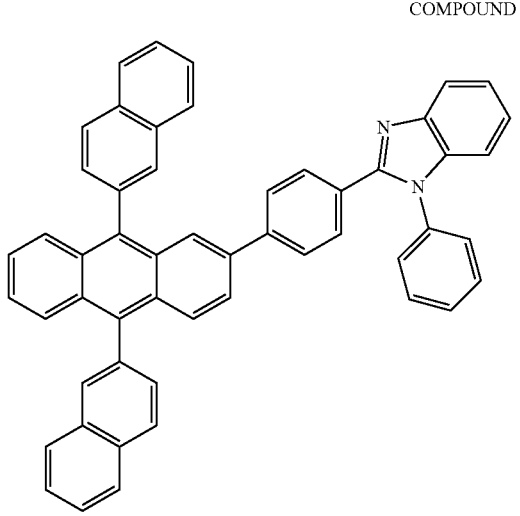

Comparative Example 1

An OLED was manufactured in the same manner as in Example 1, except that Compound D1 was used instead of Compound 101 in the formation of the EML.

COMPOUND D1

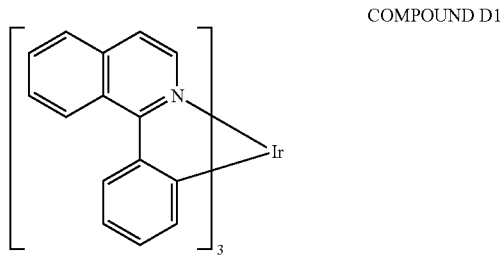

Comparative Example 2

An OLED was manufactured in the same manner as in Example 1, except that Compound D2 was used instead of Compound 101 in the formation of the EML.

COMPOUND D2

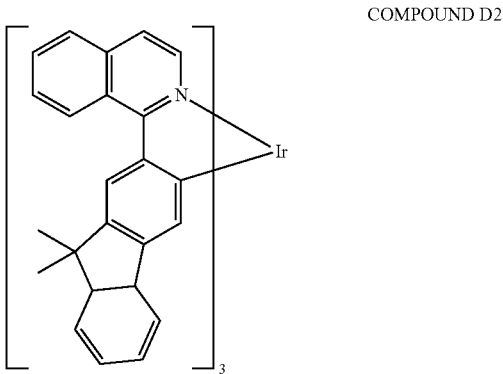

Comparative Example 3

An OLED was manufactured in the same manner as in Example 1, except that Compound D3 was used instead of Compound 101 in the formation of the EML.

COMPOUND D3

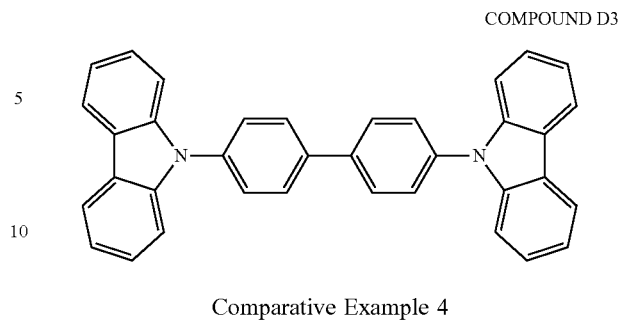

Comparative Example 4

An OLED was manufactured in the same manner as in Example 1, except that Compound D4 was used instead of Compound 101 in the formation of the EML.

COMPOUND D4

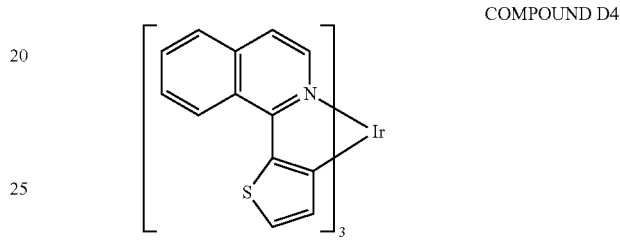

EXAMPLE 2

As an anode (Corning), a 15 Ω/cm² (1200 Å) ITO glass substrate was cut to a size of 50 mm×50 mm×0.7 mm, washed with ultrasonic waves in isopropyl alcohol and pure water for 5 minutes each, and then cleaned with UV for 30 minutes and exposed to ozone. The ITO glass substrate was mounted on a vacuum depositor.

2-TNATA was vacuum deposited on the ITO glass substrate to form a HIL having a thickness of 600 Å, and Compound 301 was then deposited on the HIL to form a HTL having a thickness of 300 Å.

Compound 101 (as a dopant) and 9,10-di(naphthalene-2-yl)anthracene (DNA) (as a host) were co-deposited on the HTL at a weight ratio of 2:98 to form an EML having a thickness of 400 Å. Then, Compound 401 was vacuum-deposited on the EML to form an ETL having a thickness of 300 Å, and LiF was deposited on the ETL to form an EIL having a thickness of 10 Å.

Al was deposited on the EIL to form a second electrode having a thickness of 3,000 Å.

Comparative Example 5

An OLED was manufactured in the same manner as in Example 2, except that Compound D1 was used instead of Compound 1 in the formation of the EML.

COMPOUND D1

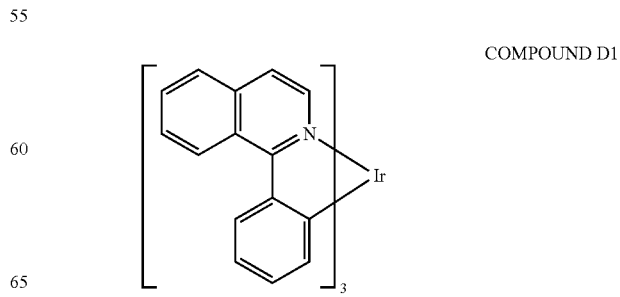

EXAMPLE 3

As an anode (Corning), a 15 Ω/cm² (1200 Å) ITO glass substrate was cut to a size of 50 mm×50 mm×0.7 mm, washed with ultrasonic waves in isopropyl alcohol and pure water for 5 minutes each, and then cleaned with UV for 30 minutes and exposed to ozone. The ITO glass substrate was mounted on a vacuum depositor.

2-TNATA was vacuum deposited on the ITO glass substrate to form a HIL having a thickness of 600 Å, and Compound 301 was then deposited on the HIL to form a HTL having a thickness of 300 Å.

Compound 101 (as a dopant) and Compound 201 (as a host) were co-deposited on the HTL at a weight ratio of 2:98 to form an EML having a thickness of 400 Å. Then, Compound 401 was vacuum-deposited on the EML to form an ETL having a thickness of 300 Å, and LiF was deposited on the ETL to form an EIL having a thickness of 10 Å.

Al was deposited on the EIL to form a second electrode having a thickness of 3,000 Å.

EXAMPLE 4

An OLED was manufactured in the same manner as in Example 1, except that Compound 102 was used instead of Compound 101 in the formation of the EML.

EXAMPLE 5

An OLED was manufactured in the same manner as in Example 1, except that Compound 103 was used instead of Compound 101 in the formation of the EML.

EXAMPLE 6

An OLED was manufactured in the same manner as in Example 1, except that Compound 202 was used instead of Compound 201 in the formation of the EML.

EXAMPLE 7

An OLED was manufactured in the same manner as in Example 1, except that Compound 203 was used instead of Compound 201 in the formation of the EML.

Comparative Example 6

An OLED was manufactured in the same manner as in Example 3, except that Compound D1 was used instead of Compound 101 in the formation of the EML.

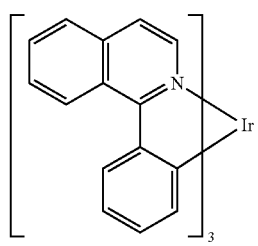

COMPOUND D1

Comparative Example 7

An OLED was manufactured in the same manner as in Example 3, except that Compound D2 was used instead of Compound 101 in the formation of the EML.

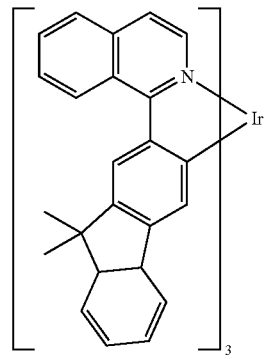

COMPOUND D2

Comparative Example 8

An OLED was manufactured in the same manner as in Example 3, except that Compound D3 was used instead of Compound 101 in the formation of the EML.

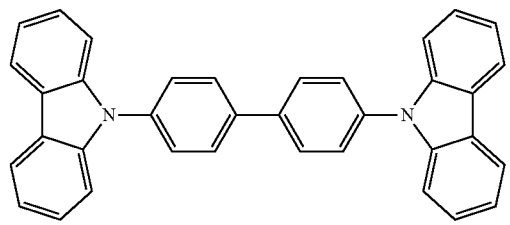

COMPOUND D3

Comparative Example 9

An OLED was manufactured in the same manner as in Example 3, except that Compound D4 was used instead of Compound 101 in the formation of the EML.

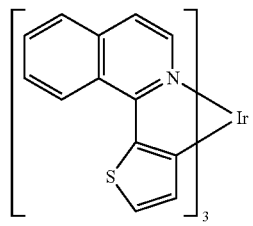

COMPOUND D4

Evaluation Example

Driving voltage, brightness, and efficiency of the OLEDs of Examples 1 to 7 and Comparative Examples 1 to 11 were evaluated using a current-voltmeter, Kethley SMU 236 (available from PhotoResearch, New York, N.Y.), to apply a voltage to the OLEDs and a brightness photometer, PR650 Spectroscan Source Measurement Unit (available from PhotoResearch, New York, N.Y.), and the results are shown in Table 1 below.

TABLE 1

| | EML | | Driving voltage | Efficiency (cd/A) |
| | Host | Dopant | HTL | @ 10 mA/cm2 | @ 10 mA/cm2 |
|---|---|---|---|---|---|
| Example 1 | Compound 201 | Compound 101 | NPB | 5.1 | 26.8 |
| Example 2 | ADN | Compound 101 | Compound 301 | 5.5 | 22.3 |
| Example 3 | Compound 201 | Compound 101 | Compound 301 | 4.8 | 28.4 |
| Example 4 | Compound 201 | Compound 102 | Compound 301 | 5.3 | 25.3 |
| Example 5 | Compound 201 | Compound 103 | Compound 301 | 5.2 | 26.1 |
| Example 6 | Compound 202 | Compound 101 | Compound 301 | 5.2 | 25.7 |
| Example 7 | Compound 203 | Compound 101 | Compound 301 | 5.1 | 24.6 |
| Comparative Example 1 | Compound 201 | Compound D1 | NPB | 6.4 | 15.1 |
| Comparative Example 2 | Compound 201 | Compound D2 | NPB | 6.8 | 14.7 |
| Comparative Example 3 | Compound 201 | Compound D3 | NPB | 6.6 | 13.1 |
| Comparative Example 4 | Compound 201 | Compound D4 | NPB | 6.2 | 14.2 |
| Comparative Example 5 | ADN | ADN | Compound 301 | 7.1 | 15.4 |
| Comparative Example 6 | Compound 201 | Compound D1 | Compound 301 | 6.6 | 18.6 |
| Comparative Example 7 | Compound 201 | Compound D2 | Compound 301 | 7.2 | 15.3 |
| Comparative Example 8 | Compound 201 | Compound D3 | Compound 301 | 6.5 | 15.8 |
| Comparative Example 9 | Compound 201 | Compound D4 | Compound 301 | 6.3 | 18.3 |

Referring to Table 1, the OLEDs of Examples 1 to 7 have lower driving voltage and thus have increased efficiency compared to those of the OLEDs of Comparative Examples 1 to 9.

As described above, according to the one or more of the above embodiments of the present disclosure, an OLED of a high quality may be provided.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the FIGURES, it will be understood by those of ordinary skill in the art that various changes in form and details may be made therein without departing from the spirit and scope of the present invention as defined by the following claims.

What is claimed is:

1. An organic light-emitting device comprising:
a first electrode;
a second electrode facing the first electrode; and
an organic layer comprising an emission layer disposed between the first electrode and the second electrode,
wherein the emission layer comprises at least one selected from the group consisting of compounds represented by Formula 1 and at least one selected from the group consisting of compounds represented by Formula 3:

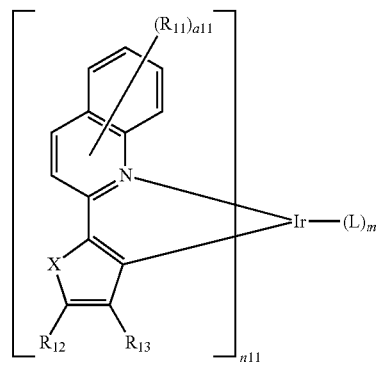

Formula 1

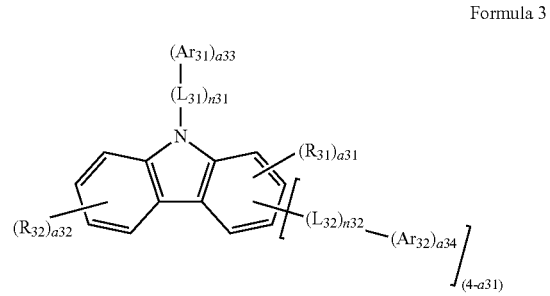

Formula 3 wherein, in Formulae 1 and 3,
$R_{11}$ is a phenyl group;
a11 is an integer of 1;
X is a sulfur atom;
$R_{12}$ and $R_{13}$ are each a hydrogen atom;
n11 is an integer of 2 or 3;

L is represented by:

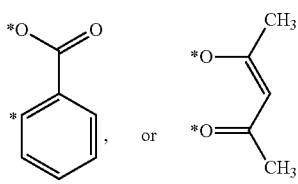

and wherein * is a binding site with Ir;
m is an integer of 0 or 1;
$Ar_{31}$ is a pyrimidyl;
$Ar_{32}$ is selected from the group consisting of
i) a dibenzofuranylene group;
ii) a phenyl group; and
iii) carbazolylene group substituted with one phenyl group;
n31 and n32 are each an integer of 0;
$R_{31}$ and $R_{32}$ are each independently selected from the group consisting of a hydrogen atom and a phenyl group; and
a31 is 3;
a32 to a34 are each an integer of 1.

2. The organic light-emitting device of claim 1, wherein the compound represented by Formula 1 is one of Compounds 101 to 103:

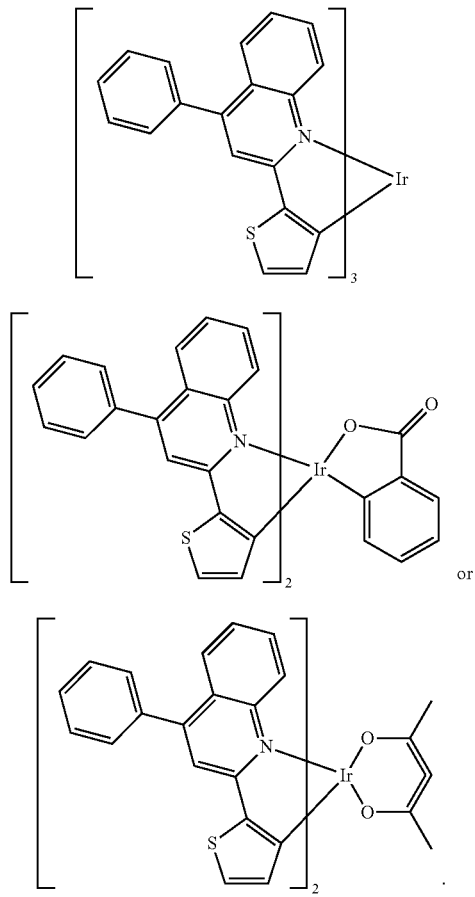

3. The organic light-emitting device of claim 1, wherein $Ar_{32}$ are each independently selected from the group consisting of
i) a dibenzofuranylene group; and
ii) a phenyl group.

4. The organic light-emitting device of claim 1, wherein the compound represented by Formula 3 is represented by Formula 3b:

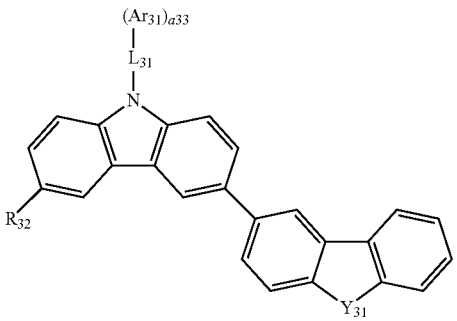

Formula 3b wherein, in Formula 3b,
$Y_{31}$ is $N(Ar_{321})$, or $C(Ar_{322})(Ar_{323})$;
$Ar_{31}$ is a pyrimidyl, $Ar_{32i}$ is a phenyl group, $Ar_{322}$, and $Ar_{323}$ are each a methyl group;
$R_{32}$ is selected from the group consisting of a hydrogen atom and a phenyl group; and
a33 is an integer of 1.

5. The organic light-emitting device of claim 1, wherein the compound represented by Formula 3 is selected from the group consisting of Compounds 201 to 203:

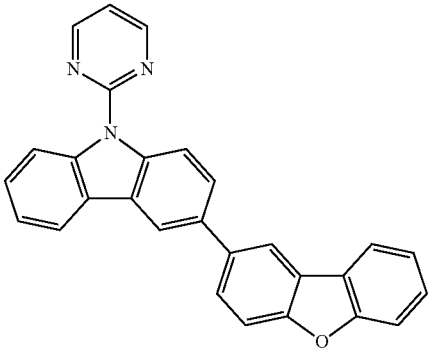

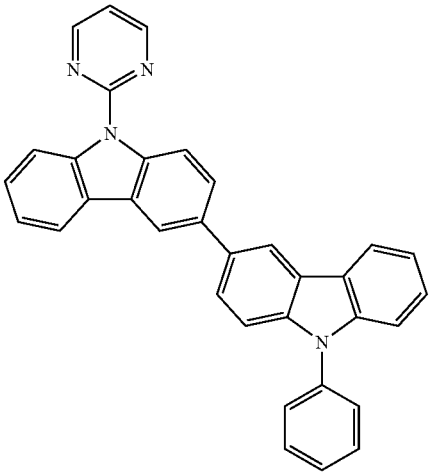

-continued

203

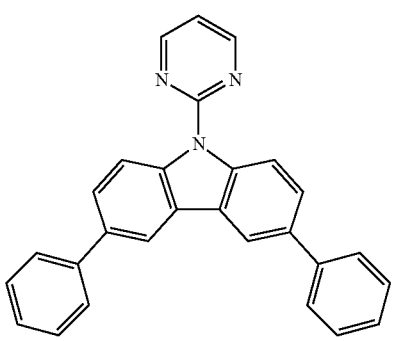

6. An organic light-emitting device comprising:
a first electrode;
a second electrode facing the first electrode;
an organic layer comprising an emission layer disposed between the first electrode and the second electrode,
wherein the emission layer comprises a hole transporting region disposed between the first electrode and the emission layer, wherein the emission layer comprises at least one selected from the group consisting of compounds represented by Formula 1, wherein the hole transporting region comprises at least one selected from the group consisting of compounds represented by Formula 4:

Formula 1

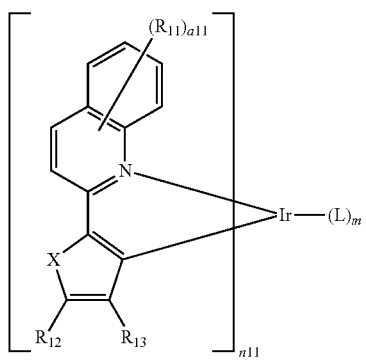

Formula 4

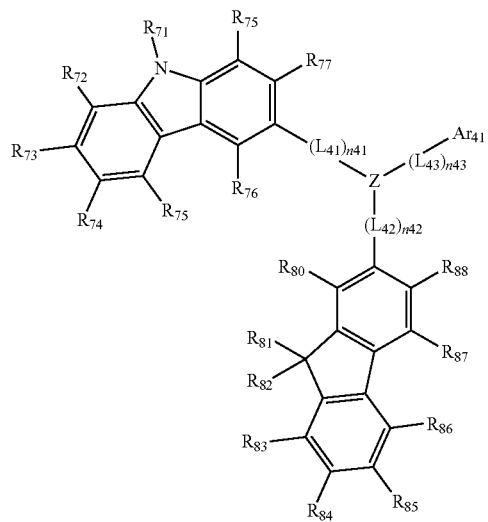

wherein, in Formulae 1 and 4,
$R_{11}$ is a phenyl group;
a11 is an integer of 1;
X is a sulfur atom;
$R_{12}$ and $R_{13}$ are each a hydrogen atom;
n11 is an integer of 2 or 3;
L is ligand represented by:

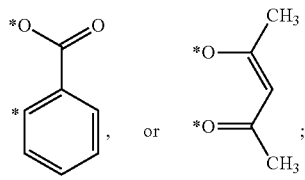

wherein * is a binding site with Ir;
m is an integer of 0 or 1;
Z is a nitrogen atom (N);
n41 to n43 are each an integer of 0;
$R_{71}$ is a phenyl;
$R_{72}$ to $R_{78}$ are each a hydrogen atom;
$R_{81}$ and $R_{82}$ are each $CH_3$;
$R_{83}$ to $R_{89}$ are each a hydrogen atom; and
$Ar_{41}$ is a phenyl.

7. An organic light-emitting device comprising:
a first electrode;
a second electrode facing the first electrode; and
an organic layer comprising an emission layer disposed between the first electrode and the second electrode,
wherein the organic layer comprises a hole transporting region disposed between the first electrode and the emission layer, wherein the emission layer comprises at least one selected from the group consisting of compounds represented by Formula 1 and at least one selected from the group consisting of compounds represented by Formula 3, wherein the hole transporting region comprises at least one selected from the group consisting of compounds represented by Formula 4:

Formula 1

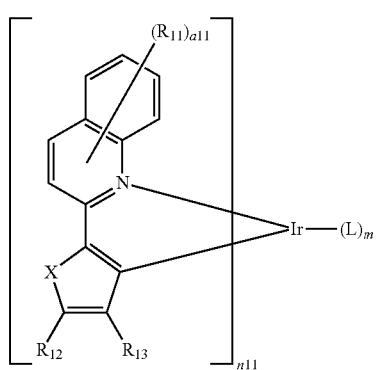

Formula 3

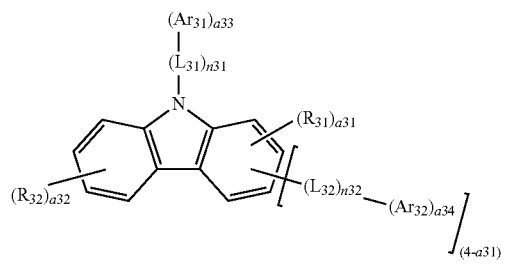

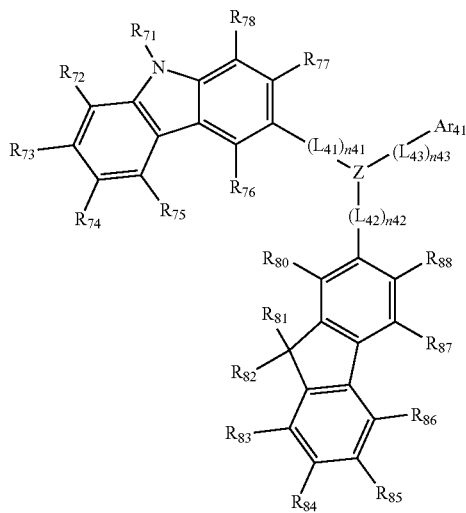

wherein, in Formulae 1, 3 and 4,
$R_{11}$ is a phenyl group;
a11 is an integer of 1;
X is a sulfur atom;
$R_{12}$ and $R_{13}$ are each a hydrogen atom;
n11 is an integer of 2 or 3;
L is represented by:

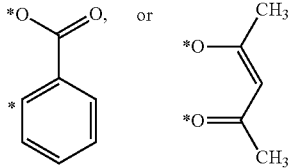

Formula 4 and
wherein * is a binding site with Ir;
m is an integer of 0 or 1;
Z is a nitrogen atom (N);
$Ar_{31}$ is a pyrimidyl;
$Ar_{32}$ is selected from the group consisting of
i) a dibenzofuranylene group;
ii) a phenyl group; and
iii) carbazolylene group substituted with one phenyl group;
n31 and n32 are each an integer of 0;
$R_{31}$ and $R_{32}$ are each a hydrogen atom; and
a31 is 3;
a32 to a34 are each independently an integer of 0 to 4
n41 to n43 are each an integer of 0;
$R_{71}$ is a phenyl;
$R_{72}$ to $R_{78}$ are each a hydrogen atom;
$R_{81}$ and $R_{82}$ are each $CH_3$;
$R_{83}$ to $R_{89}$ are each a hydrogen atom; and
$Ar_{41}$ is a phenyl.

8. The organic light-emitting device of claim 7, wherein the compound represented by Formula 4 is Compound 301:

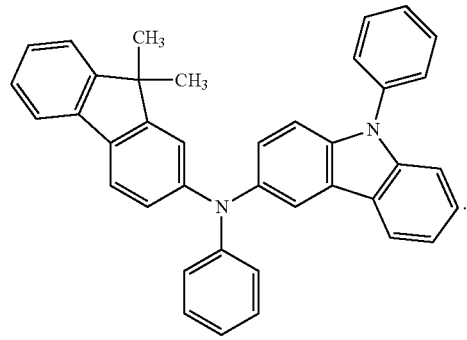

* * * * *